United States Patent
Kim et al.

(10) Patent No.: US 12,262,590 B2
(45) Date of Patent: Mar. 25, 2025

(54) DISPLAY APPARATUS CAPABLE OF DISPLAYING AN IMAGE WHERE AN ELECTRONIC COMPONENT IS ARRANGED

(71) Applicant: Samsung Display Co., Ltd., Yongin-si (KR)

(72) Inventors: Hyeongseok Kim, Yongin-si (KR); Youngwan Seo, Yongin-si (KR); Gyungsoon Park, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 181 days.

(21) Appl. No.: 17/224,970

(22) Filed: Apr. 7, 2021

(65) Prior Publication Data
US 2021/0391400 A1 Dec. 16, 2021

(30) Foreign Application Priority Data
Jun. 11, 2020 (KR) .......................... 10-2020-0071013

(51) Int. Cl.
*H10K 59/121* (2023.01)
*H10K 59/131* (2023.01)
*H10K 59/35* (2023.01)
*H10K 59/65* (2023.01)

(52) U.S. Cl.
CPC ....... *H10K 59/1213* (2023.02); *H10K 59/131* (2023.02); *H10K 59/353* (2023.02); *H10K 59/65* (2023.02)

(58) Field of Classification Search
CPC .......... G09G 3/30; G09G 3/32; G09G 3/3208; G09G 3/3216; G09G 3/3225; G09G 3/3233; G09G 3/3241; G09G 3/325; G09G 3/3258; G09G 3/3266; G09G 3/3275; G09G 3/3283; G09G 3/3291
USPC ....................................................... 345/76–83
See application file for complete search history.

(56) References Cited

U.S. PATENT DOCUMENTS

| | | | |
|---|---|---|---|
| 6,919,945 B2 | 7/2005 | Ha | |
| 9,640,681 B2 | 5/2017 | Min | |
| 10,134,826 B2 | 11/2018 | Ka et al. | |
| 10,978,538 B2 | 4/2021 | Wang et al. | |
| 11,329,116 B2 | 5/2022 | Seo et al. | |
| 11,899,862 B2 * | 2/2024 | Bok | G06F 3/0446 |
| 2010/0134535 A1 * | 6/2010 | Shidara | G09G 3/20 348/E5.062 |

(Continued)

FOREIGN PATENT DOCUMENTS

EP 1463117 A2 * 9/2004 ......... H01L 27/3269
JP 2010-230797 A 10/2010

(Continued)

*Primary Examiner* — Ke Xiao
*Assistant Examiner* — Nelson Lam
(74) *Attorney, Agent, or Firm* — Womble Bond Dickinson (US) LLP

(57) ABSTRACT

A display apparatus includes: a substrate including a main display area, a component area including a transmission area, and a peripheral area at an outer side of the main display area; a main pixel circuit at the main display area; an auxiliary pixel circuit at the component area, and including a first wire; and a bottom metal layer between the substrate corresponding to the component area and the auxiliary pixel circuit, and electrically connected to the first wire.

19 Claims, 19 Drawing Sheets

(56) References Cited

U.S. PATENT DOCUMENTS

| | | | |
|---|---|---|---|
| 2014/0292622 A1* | 10/2014 | Lee | H01L 27/3216 345/80 |
| 2015/0379923 A1* | 12/2015 | Lee | H01L 27/3272 345/82 |
| 2016/0253956 A1* | 9/2016 | Sagawa | G09G 3/3266 345/76 |
| 2016/0293883 A1* | 10/2016 | Hong | H10K 59/131 |
| 2018/0069063 A1* | 3/2018 | Kim | G02F 1/133345 |
| 2019/0013368 A1 | 1/2019 | Chung et al. | |
| 2019/0056822 A1 | 2/2019 | Lee et al. | |
| 2019/0214595 A1 | 7/2019 | Park | |
| 2020/0176527 A1 | 6/2020 | An et al. | |
| 2020/0235187 A1* | 7/2020 | Bae | H01L 27/3272 |
| 2021/0134932 A1* | 5/2021 | Chae | H01L 27/3262 |
| 2021/0376279 A1* | 12/2021 | Jeon | H01L 51/5096 |
| 2023/0119107 A1* | 4/2023 | Jeong | H10K 59/12 345/76 |
| 2024/0079527 A1* | 3/2024 | Lee | H01L 33/62 |
| 2024/0321183 A1* | 9/2024 | Park | G09G 3/32 |

FOREIGN PATENT DOCUMENTS

| | | |
|---|---|---|
| KR | 10-2003-0008380 A | 1/2003 |
| KR | 10-2017-0117291 A | 10/2017 |
| KR | 10-2019-0085202 A | 7/2019 |
| KR | 10-2031654 B1 | 10/2019 |
| KR | 10-2020-0029103 A | 3/2020 |
| KR | 10-2020-0065185 A | 6/2020 |
| KR | 10-2020-0066502 A | 6/2020 |

* cited by examiner

DISPLAY APPARATUS CAPABLE OF DISPLAYING AN IMAGE WHERE AN ELECTRONIC COMPONENT IS ARRANGED

CROSS-REFERENCE TO RELATED APPLICATION

This application claims priority to and the benefit of Korean Patent Application No. 10-2020-0071013, filed on Jun. 11, 2020, in the Korean Intellectual Property Office, the disclosure of which is incorporated by reference herein in its entirety.

BACKGROUND

1. Field

Aspects of one or more embodiments relate to a display apparatus, and more particularly, to a display apparatus with improved product reliability.

2. Description of Related Art

Recently, the usage of display apparatuses has diversified. Also, display apparatuses have become thinner and lighter, and thus, a range of use of the display apparatuses has extended.

As the display apparatuses have been utilized in various ways, various methods may be used in designing the form of the display apparatuses, and the number of functions that may be combined with or associated with the display apparatuses have increased.

The above information disclosed in this Background section is for enhancement of understanding of the background of the present disclosure, and therefore, it may contain information that does not constitute prior art.

SUMMARY

One or more example embodiments of the present disclosure are directed to a display apparatus having an extended display area so that an image may be displayed even at (e.g., in or on) an area where a component such as an electronic element is arranged. However, the aspects and features of the present disclosure are not limited to the above example.

Additional aspects and features will be set forth in part in the description which follows, and in part, will be apparent from the description, or may be learned by practicing one or more example embodiments of the present disclosure.

According to one or more example embodiments of the present disclosure, a display apparatus includes: a substrate including a main display area, a component area including a transmission area, and a peripheral area at an outer side of the main display area; a main pixel circuit at the main display area; an auxiliary pixel circuit at the component area, and including a first wire; and a bottom metal layer between the substrate corresponding to the component area and the auxiliary pixel circuit, and electrically connected to the first wire.

In an example embodiment, the first wire may be configured to transmit an initializing voltage to the auxiliary pixel circuit.

In an example embodiment, the auxiliary pixel circuit may further include a second wire, and the bottom metal layer may be electrically connected to the second wire.

In an example embodiment, the second wire may be configured to transmit the initializing voltage to the auxiliary pixel circuit.

In an example embodiment, the display apparatus may further include: a plurality of main sub-pixels at the main display area; a plurality of pixel groups at the component area and spaced from each other with the transmission area therebetween; and a plurality of bypass wires at the component area and bypassing the transmission area.

In an example embodiment, the auxiliary pixel circuit may include a plurality of auxiliary pixel circuits, each of the plurality of the pixel groups may include a plurality of auxiliary sub-pixels, each of the plurality of auxiliary sub-pixels may include an auxiliary display element electrically connected to a corresponding one of the auxiliary pixel circuits, and each of the auxiliary pixel circuits may include an auxiliary driving thin-film transistor configured to supply a driving current to the auxiliary display element, a first auxiliary initializing thin-film transistor configured to initialize a driving gate voltage of the auxiliary driving thin-film transistor, and a second auxiliary initializing thin-film transistor configured to initialize an auxiliary pixel electrode of the auxiliary display element.

In an example embodiment, the first wire may be configured to transmit the initializing voltage to the first auxiliary initializing thin-film transistor, and the second wire may be configured to transmit the initializing voltage to the second auxiliary initializing thin-film transistor.

In an example embodiment, the main pixel circuit may include a plurality of main pixel circuits, the main pixel circuits may include an initializing voltage line, each of the plurality of the main sub-pixels may include a main display element electrically connected to a corresponding one of the main pixel circuits, each of the main pixel circuits may further include a main driving thin-film transistor configured to supply a driving current to the main display element, a first main initializing thin-film transistor configured to initialize a driving gate voltage of the main driving thin-film transistor, and a second main initializing thin-film transistor configured to initialize a main pixel electrode of the main display element, and the initializing voltage line may be configured to transmit an initializing voltage to the first main initializing thin-film transistor or the second main initializing thin-film transistor.

In an example embodiment, the initializing voltage line and the bottom metal layer may be electrically connected to each other at the component area.

In an example embodiment, the initializing voltage line and the bottom metal layer may be electrically connected to each other at the main display area.

In an example embodiment, the bottom metal layer may at least partially overlap with the bypass wires.

In an example embodiment, the transmission area may have a circular shape on a plane.

In an example embodiment, the transmission area may have a polygonal shape on a plane.

In an example embodiment, the bottom metal layer may include a first hole corresponding to the transmission area.

In an example embodiment, the display apparatus may further include a component at the component area under the substrate, and the component may include an image pickup device or a sensor.

According to one or more example embodiments of the present disclosure, a display apparatus includes: a substrate including a main display area, a component area including a transmission area, and a peripheral area at an outer side of the main display area; a main pixel circuit at the main display area; an auxiliary pixel circuit at the component area, and including an auxiliary semiconductor layer; and a bottom metal layer at the substrate corresponding to the component area and the auxiliary pixel circuit, and electrically connected to the auxiliary semiconductor layer.

In an example embodiment, the auxiliary semiconductor layer and the bottom metal layer may be electrically connected to each other via a contact hole.

In an example embodiment, the main pixel circuit may further include an initializing voltage line, and the initializing voltage line may be electrically connected to the bottom metal layer.

In an example embodiment, the initializing voltage line may be configured to transmit an initializing voltage to the main pixel circuit.

In an example embodiment, the transmission area may be defined by the bottom metal layer.

These and/or other aspects and features of the present disclosure will become apparent and more readily appreciated from the following description of the example embodiments and the accompanying drawings.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
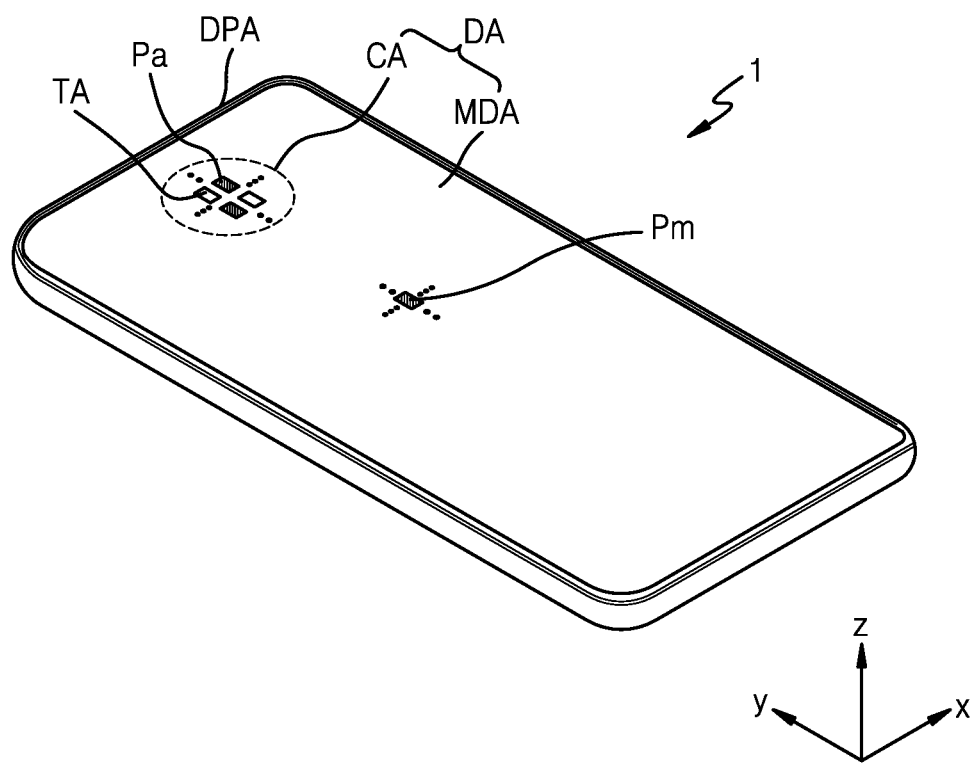
FIG. 1 is a schematic perspective view of a display apparatus, according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," "bottom," "top," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," "coupled to," or "adjacent to" another element or layer, it can be directly on, connected to, coupled to, or adjacent to the other element or layer, or one or more intervening elements or layers may be present. In contrast, when an element or layer is referred to as being "directly on," "directly connected to," "directly coupled to," or "immediately adjacent to" another element or layer, there are no intervening elements or layers present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a," "an," and "the" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," "one of," and "selected from" when preceding a list of elements, modify the entire list of elements and do not modify the individual elements of the list. For example, the expression "at least one of a, b or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

As used herein, a wire extending in a first direction or a second direction encompasses not only extending in a straight line but also extending in a zigzag pattern or in a curve in the first direction or the second direction. When referring to a "planar," an object is viewed from above, and when referring to a "sectional," a cross-section formed by vertically cutting an object is viewed from the side. The term "overlapping" encompasses "planar" overlapping and/or "cross-sectional" overlapping.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus 1, according to an embodiment.

Referring to FIG. 1, the display apparatus 1 includes a display area DA, and a peripheral area DPA located at an outer side of the display area DA. For example, in some embodiments, the peripheral area DPA may at least partially surround (e.g., around a periphery of) the display area DA. The display area DA may include a component area CA, and a main display area MDA at least partially surrounding (e.g., around a periphery of) the component area CA. In other words, the component area CA and the main display area MDA may each individually display an image or may display an image together. The peripheral area DPA may be a kind of a non-display area at (e.g., in or on) which display elements are not arranged. In an embodiment, the display area DA may be entirely surrounded (e.g., around a periphery thereof) by the peripheral area DPA.

FIG. 1 illustrates one component area CA located at (e.g., in or on) the main display area MDA, but the present disclosure is not limited thereto. For example, in another embodiment, the display apparatus 1 may have at least two component areas CA, and a plurality of component areas CA may have the same or different shapes and/or sizes. In a view (e.g., a plan view) from a direction perpendicular to or substantially perpendicular to (e.g., approximately perpendicular to) an upper surface of the display apparatus 1, the component area CA may have any suitable shape from among various suitable shapes, for example, such as a polygon including a rectangle, a square, a star, a diamond, and/or the like, a circle, an oval, and/or the like. In addition, although FIG. 1 illustrates that the component area CA is arranged at a center of an upper area (e.g., in a y direction) of the main display area MDA that has a rectangular or substantially rectangular shape (e.g., an approximately rectangular shape) in a view (e.g., a plan view) from a direction perpendicular to or substantially perpendicular to an upper surface of the display apparatus 1, the component area CA may be arranged at one side, for example, at a upper right side or a upper left side, of the main display area MDA having the rectangular shape.

The display apparatus 1 may provide an image by using a plurality of main sub-pixels Pm arranged at (e.g., in or on) the main display area MDA, and/or by using a plurality of auxiliary sub-pixels Pa arranged at (e.g., in or on) the component area CA.

As described in more detail with reference to FIG. 2, in the component area CA, a component 20, which is an electronic element, may be arranged under a substrate 100 to correspond to the component area CA. The component 20 may be, for example, a camera that uses infrared or visible light, and may include an image pickup device. In other examples, the component 20 may be a solar cell, a flash, a photo resistor, a proximity sensor, an iris sensor, and/or the like. In another example, the component 20 may be a device have a function of receiving sound. In order to minimize or reduce a limitation of such a function of the component 20, the component area CA may include a transmission area TA through which light and/or sound output to the outside from the component 20 may be transmitted, and/or through which light and/or sound traveling toward the component 20 from the outside may be transmitted. In the case of a display apparatus according to an embodiment, when light is transmitted through the component area CA, a light transmittance may be about 10% or more, for example, about 40% or more, about 25% or more, about 50% or more, about 85% or more, or about 90% or more.

The plurality of auxiliary sub-pixels Pa may be arranged at (e.g., in or on) the component area CA. The plurality of auxiliary sub-pixels Pa may provide an image by emitting light. An image displayed on the component area CA may be referred to as an auxiliary image, and may have a lower resolution than an image displayed on the main display area MDA. In other words, the component area CA includes the transmission area TA through which light and/or sound may be transmitted, and when a sub-pixel is not arranged above the transmission area TA, the number of auxiliary sub-pixels Pa that may be arranged per unit area at (e.g., in or on) the component area CA may be less than the number of main sub-pixels Pm that may be arranged per unit area at (e.g., in or on) the main display area MDA.

Figure 2:
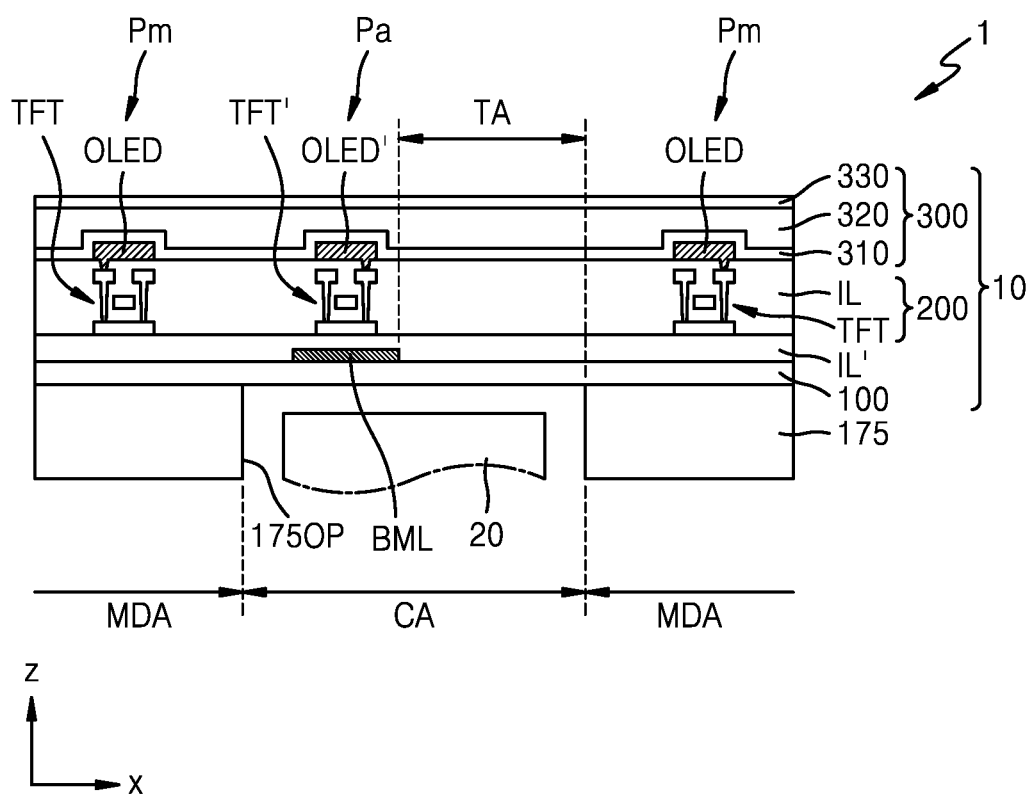
FIG. 2 is a schematic cross-sectional view of a display apparatus, according to an embodiment.

FIG. 2 is a schematic cross-sectional view of a display apparatus, according to an embodiment.

Referring to FIG. 2, the display apparatus 1 may include a display panel 10 including a display element, and the component 20 corresponding to the component area CA.

The display panel 10 may include a substrate 100, a display element layer 200 arranged above the substrate 100, and a thin-film encapsulation layer 300 as a sealing member for sealing the display element layer 200. In addition, the display panel 10 may further include a lower protective film 175 arranged below the substrate 100.

The substrate 100 may include glass or a polymer resin. The polymer resin may include, for example, polyethersulfone, polyacrylate, polyether imide, polyethylene naphthalate, polyethylene terephthalate, polyphenylene sulfide, polyarylate, polyimide, polycarbonate, or cellulose acetate propionate. The substrate 100 including the polymer resin may be flexible, rollable, and/or bendable. The substrate 100 may have a multi-layered structure including a layer including the above-described polymer resin, and an inorganic layer.

The display element layer 200 may include a circuit layer including thin-film transistors TFT and TFT', organic light-emitting diodes OLED and OLED' as display elements, and insulating layers IL and IL' therebetween.

A main thin-film transistor TFT and a main organic light-emitting diode OLED connected thereto may be arranged at (e.g., in or on) the main display area MDA of the display panel 10 to implement a main sub-pixel Pm. An auxiliary thin-film transistor TFT' and an auxiliary organic light-emitting diode OLED' connected thereto may be arranged at (e.g., in or on) the component area CA to implement an auxiliary sub-pixel Pa. An area at (e.g., in or on) which the auxiliary sub-pixel Pa is arranged in the component area CA may be referred to as an auxiliary display area.

In addition, the transmission area TA having no display elements arranged therein may be arranged at (e.g., in or on) the component area CA. The transmission area TA may be an area through which light and/or a signal emitted from the component 20 arranged to correspond to the component area CA and/or light and/or a signal incident on the component 20 is transmitted. The auxiliary display area and the transmission area TA may be alternately arranged at (e.g., in or on) the component area CA.

A bottom metal layer BML may be arranged at (e.g., in or on) the component area CA. The bottom metal layer BML may be arranged to correspond to a bottom portion of the auxiliary thin-film transistor TFT'. The bottom metal layer BML may block or substantially block external light from reaching the auxiliary sub-pixel Pa including the auxiliary thin-film transistor TFT'. For example, the bottom metal layer BML may block or substantially block light emitted from the component 20 from reaching the auxiliary sub-pixel Pa. In some embodiments, a constant voltage or a signal is applied to the bottom metal layer BML such that damage to a pixel circuit due to electrostatic discharge may be prevented or substantially prevented.

The thin-film encapsulation layer 300 may include at least one inorganic encapsulation layer and at least one organic encapsulation layer. For example, FIG. 2 illustrates a first inorganic encapsulation layer 310, a second inorganic encapsulation layer 330, and an organic encapsulation layer 320 between the first inorganic encapsulation layer 310 and the second inorganic encapsulation layer 330.

The first inorganic encapsulation layer 310 and the second inorganic encapsulation layer 330 may include at least one inorganic insulation material, for example, such as aluminum oxide, titanium oxide, tantalum oxide, hafnium oxide, zinc oxide, silicon oxide, silicon nitride, or silicon oxynitride. The organic encapsulation layer 320 may include a polymer-based material. Examples of the polymer-based material may include an acrylic resin, an epoxy resin, polyimide, and polyethylene.

The lower protective film 175 may be attached under the substrate 100 to support and protect the substrate 100. The lower protective film 175 may include an opening 175OP corresponding to the component area CA. The lower protective film 175 may include the opening 175OP, thereby improving a light transmittance of the component area CA. The lower protective film 175 may include polyethylene terephthalate or polyimide.

An area of the component area CA may be greater than an area in which the component 20 is arranged. Accordingly, an area of the opening 175OP provided in the lower protective film 175 may not be equal to the area of the component area CA. For example, the area of the opening 175OP may be less than the area of the component area CA.

In addition, a plurality of components 20 may be arranged in the component area CA. The plurality of components 20 may have different functions from each other. For example, one of the plurality of components 20 may be a camera, and another of the plurality of components 20 may be an infrared sensor.

In some embodiments, various suitable elements or layers such as an input sensing member (e.g., a touchscreen layer or panel) for sensing a touch input, an anti-reflection member (e.g., an anti-reflection layer or film) including a polarizer and/or a retarder or a color filter and/or a black matrix, and/or a transparent window may be further arranged above the display panel 10.

In addition, in the present embodiment, the thin-film encapsulation layer 300 is used as a sealing member for sealing the display element layer 200, but the present disclosure is not limited thereto. For example, a sealing substrate which is bonded to the substrate 100 by using a sealant or a frit may be used as a member for sealing the display element layer 200.

Figure 3:
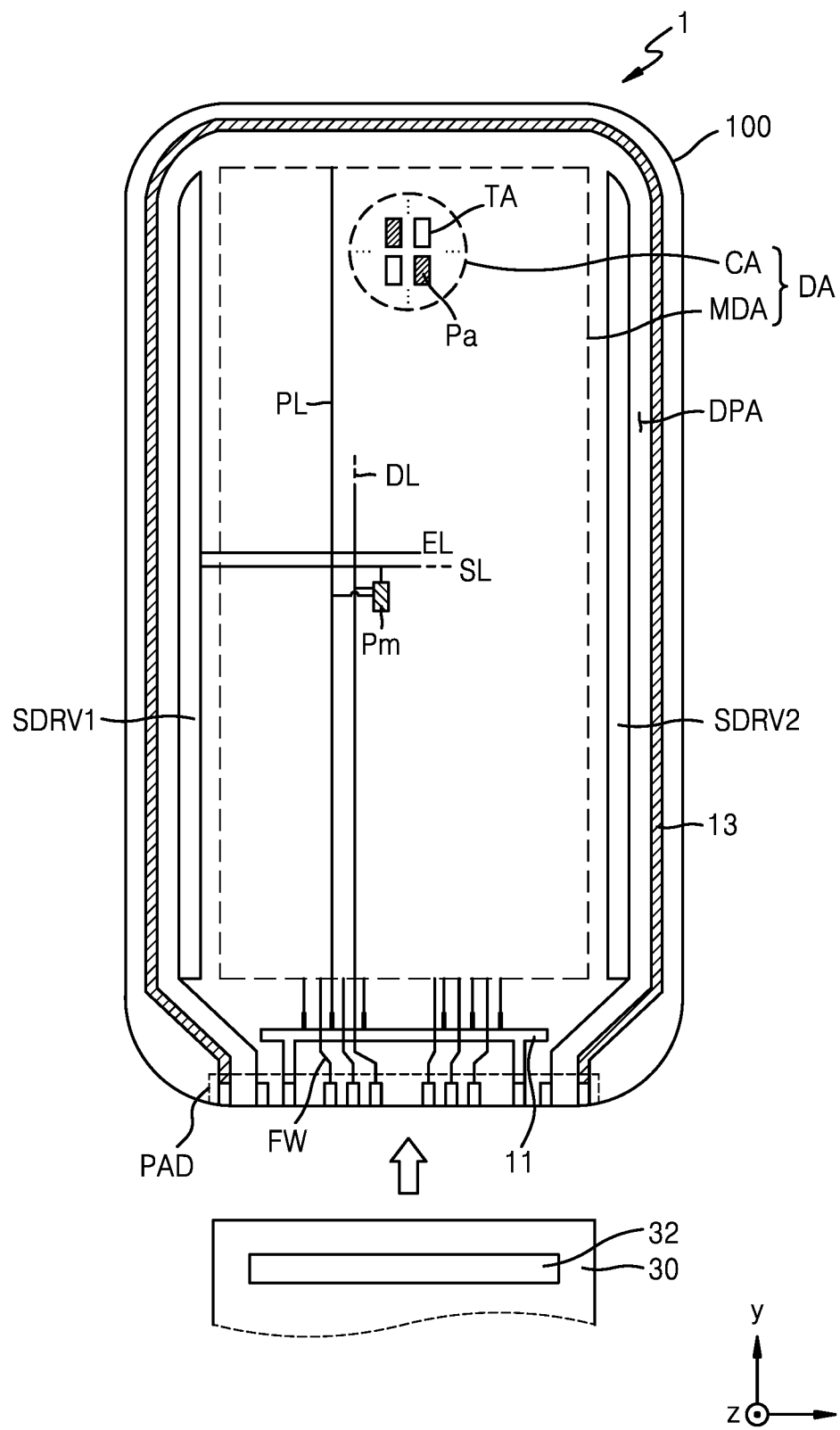
FIG. 3 is a schematic top plan view of a display apparatus, according to an embodiment.

FIG. 3 is a schematic top plan view of a display apparatus, according to an embodiment.

Referring to FIG. 3, various elements constituting the display apparatus 1 are arranged above the substrate 100. The substrate 100 includes the display area DA and the peripheral area DPA surrounding (e.g., around a periphery of) the display area DA. The display area DA includes the main display area MDA at (e.g., in or on) which a main image is displayed, and the component area CA which has the transmission area TA and at (e.g., in or on) which an auxiliary image is displayed. The auxiliary image may form a single entire image together with the main image, or may be an image independent from the main image.

A plurality of main sub-pixels Pm may be arranged at (e.g., in or on) the main display area MDA. Each of the plurality of main sub-pixels Pm may be implemented as a display element, for example, such as an organic light-emitting diode OLED. Each main sub-pixel Pm may emit, for example, red light, green light, blue light, or white light. The main display area MDA may be covered by a sealing member, and may be protected from ambient air and/or moisture.

The component area CA may be located at one side of the main display area MDA as described above, or may be arranged at an inner side of the display area DA and surrounded (e.g., around a periphery thereof) by the main display area MDA. A plurality of auxiliary sub-pixels Pa are arranged at (e.g., in or on) the component area CA. Each of the plurality of auxiliary sub-pixels Pa may be implemented as a display element, for example, such as an organic light-emitting diode OLED. Each of the plurality of auxiliary sub-pixels Pa may emit, for example, red light, green light, blue light, or white light. The component area CA may be covered with an encapsulation member, and thus, may be protected from ambient air, moisture, and/or the like.

In addition, the component area CA may include the transmission area TA. The transmission area TA may be arranged, for example, to surround (e.g., around a periphery of) a plurality of auxiliary sub-pixels Pa. In another example, the transmission area TA and a plurality of auxiliary sub-pixels Pa may be arranged in a grid shape.

Because the component area CA includes the transmission area TA, a resolution of the component area CA may be less than a resolution of the main display area MDA. For example, the resolution of the component area CA may be, for example, about ½, ⅜, ⅓, ¼, ⅖, ⅛, ⅑, or ¹⁄₁₆ of the resolution of the main display area MDA. For example, the resolution of the main display area MDA may be greater than or equal to about 400 ppi, and the resolution of the component area CA may be about 200 ppi or about 100 ppi.

Each pixel circuit that drives a main sub-pixel Pm or an auxiliary sub-pixel Pa may be electrically connected to external circuits arranged at (e.g., in or on) the peripheral area DPA. A first scan driving circuit SDRV1, a second scan driving circuit SDRV2, a terminal PAD, a driving voltage supply line 11, and a common voltage supply line 13 may be arranged at (e.g., in or on) the peripheral area DPA.

The first scan driving circuit SDRV1 may apply a scan signal to corresponding ones of the pixel circuits that drive a main sub-pixel Pm or an auxiliary sub-pixel Pa via a scan line SL. The first scan driving circuit SDRV1 may apply a light-emission control signal to the corresponding ones of the pixel circuits via a light-emission control line EL. The second scan driving circuit SDRV2 may be on the opposite side of the substrate 100 from that of the first scan driving circuit SDRV1 with respect to the main display area MDA, and may be parallel to or substantially parallel to (e.g., approximately parallel to) the first scan driving circuit SDRV1. Some of the pixel circuits of the main sub-pixels Pm of the main display area MDA may be electrically connected to the first scan driving circuit SDRV1, and others of the pixel circuits thereof may be electrically connected to the second scan driving circuit SDRV2. Some of the pixel circuits of the auxiliary sub-pixels Pa of the component area CA may be electrically connected to the first scan driving circuit SDRV1, and others of the pixel circuits thereof may be electrically connected to the second scan driving circuit SDRV2. However, the present disclosure is not limited thereto, and the second scan driving circuit SDRV2 may be omitted such that each of the pixel circuits of the main sub-pixels Pm and the auxiliary sub-pixels Pa may receive signals from the first scan driving circuit SDRV1.

The terminal PAD may be at one side of the substrate 100. The terminal PAD is exposed by not being covered by an insulating layer, and is connected to a display circuit board 30. A display driver 32 may be arranged at (e.g., in or on) the display circuit board 30.

The display driver 32 may generate a control signal that is transmitted to the first scan driving circuit SDRV1 and the second scan driving circuit SDRV2. The display driver 32 may generate a data signal, and the generated data signal may be transmitted to the pixel circuits of the main sub-pixels Pm and the auxiliary sub-pixels Pa via a fan-out wire FW and a data line DL connected to the fan-out wire FW.

The display driver 32 may apply a driving voltage ELVDD to the driving voltage supply line 11, and may apply a common voltage ELVSS to the common voltage supply line 13. The driving voltage ELVDD may be applied to the pixel circuits of the main sub-pixels Pm and the auxiliary sub-pixels Pa via a driving voltage line PL connected to the driving voltage supply line 11, and the common voltage ELVSS may be applied to an opposite electrode of a display element via a connection to the common voltage supply line 13.

The driving voltage supply line 11 may extend in an x direction below the main display area MDA. The common voltage supply line 13 has a loop shape having one side that is open, and thus, may partially surround (e.g., around a periphery of) the main display area MDA.

Figure 4:
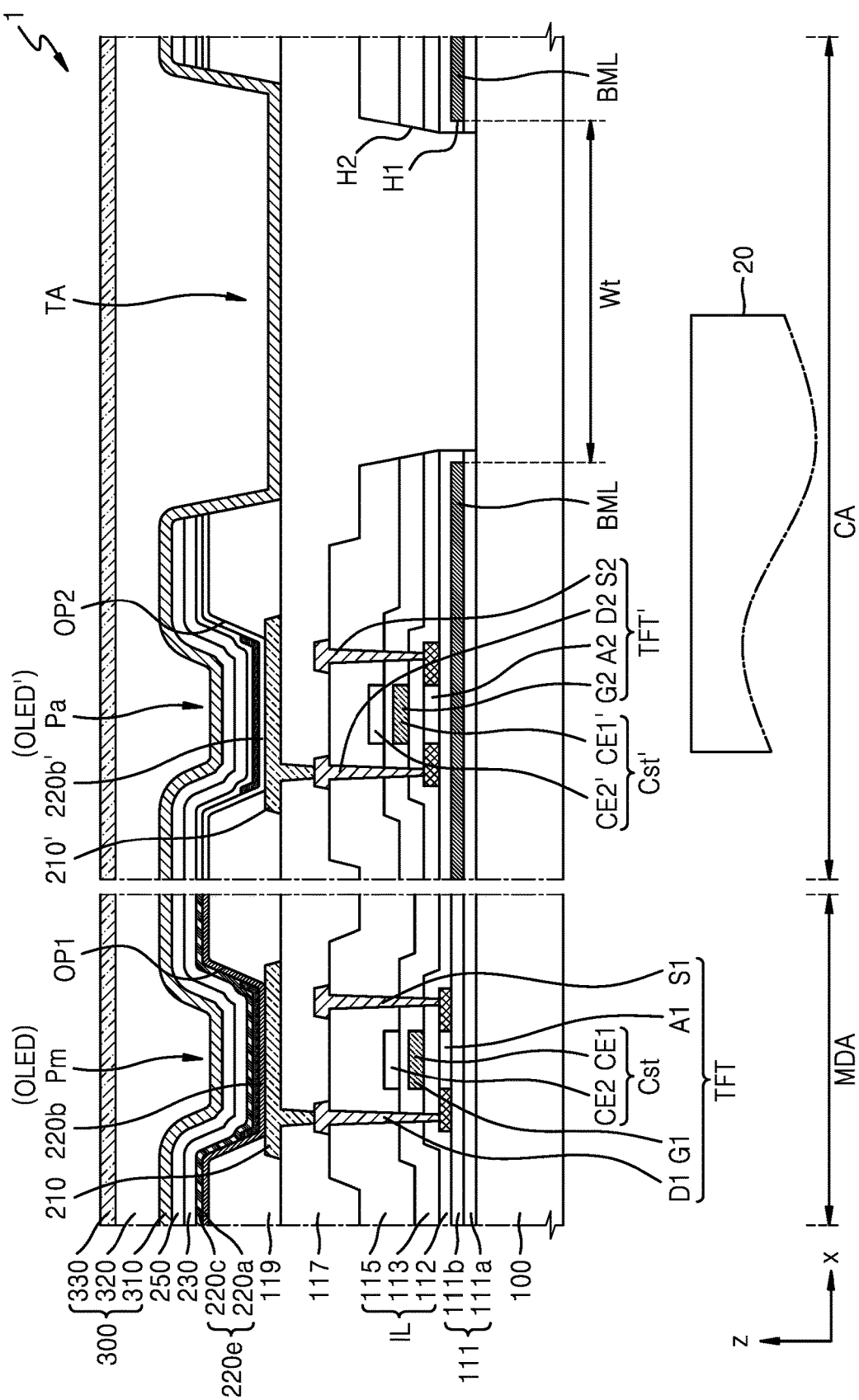
FIG. 4 is a schematic cross-sectional view of a display apparatus, according to an embodiment.

FIG. 4 is a schematic cross-sectional view of a display apparatus, according to an embodiment. FIG. 4 is a schematic cross-sectional view illustrating a portion of the display apparatus 1 according to an embodiment, and is a schematic cross-sectional view of the main display area MDA and the component area CA.

Referring to FIG. 4, the display apparatus 1 may include the main display area MDA and the component area CA. The main sub-pixel Pm may be arranged at (e.g., in or on) the main display area MDA, and the auxiliary sub-pixel Pa may be arranged at (e.g., in or on) the component area CA. The component area CA may include the transmission area TA.

A main pixel circuit including the main thin-film transistor TFT and a main storage capacitor Cst, and the main organic light-emitting diode OLED as a main display element connected to the main pixel circuit may be arranged at (e.g., in or on) the main display area MDA. An auxiliary pixel circuit including the auxiliary thin-film transistor TFT' and an auxiliary storage capacitor Cst', and the auxiliary organic light-emitting diode OLED' as an auxiliary display element connected to the auxiliary pixel circuit may be arranged at (e.g., in or on) the component area CA.

Although an organic light-emitting diode is used as a display element in the present embodiment, the present disclosure is not limited thereto, and an inorganic light-emitting device, a quantum dot light-emitting device, or the like may be used as the display element in other embodiments.

A buffer layer 111 may be arranged above the substrate 100. The buffer layer 111 may be above the substrate 100, and may reduce or block infiltration of a foreign material, moisture, and/or ambient air from a bottom of the substrate 100. The buffer layer 111 may provide a flat or substantially flat surface on the substrate 100. The buffer layer 111 may include an inorganic material, for example, such as an oxide or a nitride, an organic material, or an organic and inorganic compound, and may have a single-layer structure or a multi-layered structure including an inorganic material and an organic material. A barrier layer may be further included between the substrate 100 and the buffer layer 111 to block or substantially block penetration of ambient air. In some embodiments, the buffer layer 111 may include at least one of silicon oxide ($SiO_2$), silicon nitride ($SiN_x$), and silicon oxynitride ($SiO_xN_y$). The buffer layer 111 may have a structure in which a first buffer layer 111a and a second buffer layer 111b are stacked. Here, the first buffer layer 111a and the second buffer layer 111b may include different materials from each other. For example, the first buffer layer 111a may include silicon nitride, and the second buffer layer 111b may include silicon oxide. The buffer layer 111 arranged at (e.g., in or on) the component area CA may have an opening corresponding to the transmission area TA. Although FIG. 4 illustrates that at least a portion of the first buffer layer 111a and the second buffer layer 111b are removed at the transmission area TA, such that the first buffer layer 111a and the second buffer layer 111b include an opening corresponding to the transmission area TA, the present disclosure is not limited thereto. For example, in some embodiments, the first buffer layer 111a overlapping the transmission area TA may not be removed and may be arranged above the substrate 100. In addition, in some embodiments, the second buffer layer 111b overlapping the transmission area TA may not be removed and may be arranged above the substrate 100.

The bottom metal layer BML may be between the first buffer layer 111a and the second buffer layer 111b at (e.g., in or on) the component area CA. In another embodiment, the bottom metal layer BML may be between the substrate 100 and the first buffer layer 111a at (e.g., in or on) the component area CA. The bottom metal layer BML may be arranged below the auxiliary thin-film transistor TFT', and may prevent or substantially prevent characteristics of the auxiliary thin-film transistor TFT' from being deteriorated by light emitted from the component 20 and/or the like.

The bottom metal layer BML may include, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The bottom metal layer BML may be a single layer or multiple layers, which may include any one or more of the aforementioned materials.

The bottom metal layer BML of the component area CA may overlap with an auxiliary pixel circuit PC' arranged at (e.g., in or on) the component area CA. For example, the bottom metal layer BML of the component area CA may be provided to correspond to the entire component area CA. In this case, the bottom metal layer BML may include a first hole H1 corresponding to the transmission area TA. In some embodiments, a shape and/or a size of the transmission area TA may be defined by a shape and/or a size of the first hole H1 defined in the bottom metal layer BML. A narrowest width Wt of the transmission area TA may be equal to or substantially equal to a width of the first hole H1 defined in the bottom metal layer BML.

In an embodiment, the bottom metal layer BML may not be arranged at (e.g., in or on) the main display area MDA. When the bottom metal layer BML is provided on an entire surface or on a substantial portion of the substrate 100, defects may occur in a process of crystallizing a semiconductor layer of the main thin-film transistor TFT by using a laser.

The main thin-film transistor TFT and the auxiliary thin-film transistor TFT' may be arranged on the buffer layer 111. The main thin-film transistor TFT includes a main semiconductor layer A1, a main gate electrode G1, a main source electrode S1, and a main drain electrode D1. The auxiliary thin-film transistor TFT' includes an auxiliary semiconductor layer A2, an auxiliary gate electrode G2, an auxiliary source electrode S2, and an auxiliary drain electrode D2. The main thin-film transistor TFT may be connected to the main organic light-emitting diode OLED, and may drive the main organic light-emitting diode OLED. The auxiliary thin-film transistor TFT' may be connected to the auxiliary organic light-emitting diode OLED', and may drive the auxiliary organic light-emitting diode OLED'.

The main semiconductor layer A1 and the auxiliary semiconductor layer A2 may be arranged on the buffer layer 111, and may include poly silicon. In another embodiment, the main semiconductor layer A1 and the auxiliary semiconductor layer A2 may include amorphous silicon. In another embodiment, the main semiconductor layer A1 and the auxiliary semiconductor layer A2 may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The main semiconductor layer A1 and the auxiliary semiconductor layer A2 may include a channel area, an impurity-doped source area, and an impurity-doped drain area.

The auxiliary semiconductor layer A2 may overlap with the bottom metal layer BML with the buffer layer 111 therebetween. In an embodiment, a width (e.g., in the x direction) of the auxiliary semiconductor layer A2 may be less than a width (e.g., in the x direction) of the bottom metal layer BML, and accordingly, in a view (e.g., a plan view) from a direction perpendicular to or substantially perpendicular to the substrate 100, the auxiliary semiconductor layer A2 may entirely overlap with the bottom metal layer BML.

A first insulating layer 112 may be provided to cover the main semiconductor layer A1 and the auxiliary semiconductor layer A2. The first insulating layer 112 may include an inorganic insulation material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 112 may be a single layer or multiple layers, which include one or more of the above inorganic insulation materials.

The main gate electrode G1 overlapping with the main semiconductor layer A1 may be arranged on the first insulating layer 112, and the auxiliary gate electrode G2 overlapping with the auxiliary semiconductor layer A2 may be arranged on the first insulating layer 112. The main gate electrode G1 and the auxiliary gate electrode G2 may include, for example, molybdenum (Mo), aluminum (Al), copper (Cu), and/or titanium (Ti), and may be a single layer or multiple layers.

A second insulating layer 113 may be provided to cover the main gate electrode G1 and the auxiliary gate electrode G2. The second insulating layer 113 may include an inorganic insulation material, for example, such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second insulating layer 113 may be a single layer or multiple layers, which include one or more of the above inorganic insulation materials.

A main upper electrode CE2 of the main storage capacitor Cst and an auxiliary upper electrode CE2' of the auxiliary storage capacitor Cst' may be arranged on the second insulating layer 113.

The main upper electrode CE2 may overlap with the main gate electrode G1 arranged below the main upper electrode CE2 at (e.g., in or on) the main display area MDA. The main gate electrode G1 and the main upper electrode CE2 overlapping with each other with the second insulating layer 113 therebetween may form the main storage capacitor Cst. The main gate electrode G1 may be integrally arranged with a main lower electrode CE1 of the main storage capacitor Cst. However, the present disclosure is not limited thereto, and in an embodiment, the main storage capacitor Cst may not overlap with the main thin-film transistor TFT, and the main lower electrode CE1 of the main storage capacitor Cst may be an element independent from the main gate electrode G1 of the main thin-film transistor TFT.

The auxiliary upper electrode CE2' may overlap with the auxiliary gate electrode G2 arranged under the auxiliary upper electrode CE2' at (e.g., in or on) the component area CA. The auxiliary gate electrode G2 and the auxiliary upper electrode CE2' overlapping with each other with the second insulating layer 113 therebetween may form the auxiliary storage capacitor Cst'. The auxiliary gate electrode G2 may be integrally arranged with an auxiliary lower electrode CE1' of the auxiliary storage capacitor Cst'. However, the present disclosure is not limited thereto, and in an embodiment, the auxiliary storage capacitor Cst' may not overlap with the auxiliary thin-film transistor TFT', and the auxiliary lower electrode CE1' of the auxiliary storage capacitor Cst' may be an element independent from the auxiliary gate electrode G2 of the auxiliary thin-film transistor TFT'.

The main upper electrode CE2 and the auxiliary upper electrode CE2' may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may be a single layer or multiple layers, which include one or more of any of the aforementioned materials.

A third insulating layer 115 may be formed to cover the main upper electrode CE2 and the auxiliary upper electrode CE2'. The third insulating layer 115 may include an inorganic insulation material, for example, such as silicon oxide ($SiO_2$), silicon nitride ($SiN_x$), silicon oxynitride ($SiO_xN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$). The third insulating layer 115 may be a single layer or multiple layers including one or more of the above inorganic insulation materials.

The first insulating layer 112, the second insulating layer 113, and the third insulating layer 115 may be collectively referred to as an inorganic insulating layer IL, and the inorganic insulating layer IL may have a second hole H2 corresponding to the transmission area TA. The second hole H2 may expose a portion of an upper surface of the substrate 100. In addition, in some embodiments, when the buffer layer 111 is arranged at (e.g., in or on) the transmission area TA, the second hole H2 may expose a portion of an upper surface of the buffer layer 111. The second hole H2 may be formed by overlapping an opening of the first insulating layer 112, an opening of the second insulating layer 113, and an opening of the third insulating layer 115 with each other, the openings being formed to correspond to the transmission area TA. These openings may be individually formed via separate processes, or may be concurrently (e.g., simultaneously) formed via the same process. When these openings are formed via separate processes, an inner side surface of the second hole H2 may not be smooth and may have a step-like shape (e.g., a step).

The main source electrode S1, the main drain electrode D1, the auxiliary source electrode S2, and the auxiliary drain electrode D2 may be arranged on the third insulating layer 115. The main source electrode S1, the main drain electrode D1, the auxiliary source electrode S2, and the auxiliary drain electrode D2 may include a conductive material including, for example, molybdenum (Mo), aluminum (Al), copper (Cu), titanium (Ti), and/or the like, and may be a single layer or multiple layers including one or more of these conductive materials. For example, the main source electrode S1, the main drain electrode D1, the auxiliary source electrode S2, and the auxiliary drain electrode D2 may have a multi-layer structure of Ti/Al/Ti.

A planarization layer 117 may be arranged to cover the main source electrode S1, the main drain electrode D1, the auxiliary source electrode S2, and the auxiliary drain electrode D2. The planarization layer 117 may have a flat or substantially flat upper surface so that a main pixel electrode 210 and an auxiliary pixel electrode 210' may be arranged to be flat or substantially flat on the planarization layer 117.

The planarization layer 117 may include an organic material or an inorganic material, and may have a single-layered structure or a multi-layered structure. In an embodiment, the planarization layer 117 may be provided as a first planarization layer and a second planarization layer. Accordingly, a conductive pattern, for example, such as a wire, may be formed between the first planarization layer and the second planarization layer to implement high-density integration.

The planarization layer 117 may include, for example, a commercial polymer such as benzocyclobutene (BCB), polyimide, hexamethyldisiloxane (HMDSO), polymethyl methacrylate (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, or a vinyl alcohol-based polymer. In addition, the planarization layer 117 may include an inorganic insulation material, for example, such as silicon oxide ($SiO_2$), silicon nitride ($SiN_x$), silicon oxynitride ($SiO_xN_Y$), aluminum oxide ($Al_2O_3$), titanium oxide ($TiO_2$), tantalum oxide ($Ta_2O_5$), hafnium oxide ($HfO_2$), or zinc oxide ($ZnO_2$). For example, the planarization layer 117 may include a transparent material. In forming the planarization layer 117, a layer may be formed, and then chemical and mechanical polishing may be performed on an upper surface of the layer to provide a flat or substantially flat upper surface.

In an embodiment, the planarization layer 117 may be arranged above the transmission area TA. For example, the planarization layer 117 may be arranged above the transmission area TA to cover the first hole H1 defined by the bottom metal layer BML and the second hole H2 defined by the inorganic insulating layer IL.

The planarization layer 117 may include a via hole exposing at least one of the main source electrode S1 of the main thin-film transistor TFT or the main drain electrode D1 of the main thin-film transistor TFT, and may include a via hole exposing at least one of the auxiliary source electrode S2 of the auxiliary thin-film transistor TFT' or the auxiliary drain electrode D2 of the auxiliary thin-film transistor TFT'.

The main organic light-emitting diode OLED and the auxiliary organic light-emitting diode OLED' may be arranged on the planarization layer 117. The main pixel electrode 210 of the main organic light-emitting diode OLED may be electrically connected to the main thin-film transistor TFT by contacting the main source electrode S1 or the main drain electrode D1 via the via hole provided in the planarization layer 117. The auxiliary pixel electrode 210' of the auxiliary organic light-emitting diode OLED' may be electrically connected to the auxiliary thin-film transistor TFT' by contacting the auxiliary source electrode S2 or the auxiliary drain electrode D2 via the via hole provided in the planarization layer 117.

The main pixel electrode 210 may be arranged on the planarization layer 117 of the main display area MDA, and the auxiliary pixel electrode 210' may be arranged on the planarization layer 117 of the component area CA.

The main pixel electrode 210 and the auxiliary pixel electrode 210' may include a conductive oxide, for example, such as indium tin oxide (ITO), indium zinc oxide (IZO), zinc oxide (ZnO), indium oxide ($In_2O_3$), indium gallium oxide (IGO), or aluminum zinc oxide (AZO). The main pixel electrode 210 and the auxiliary pixel electrode 210' may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), or a compound thereof. For example, the main pixel electrode 210 and the auxiliary pixel electrode 210' may have a structure having one or more films formed of ITO, IZO, ZnO, or $In_2O_3$ above/below the reflective film. In this case, the main pixel electrode 210 and the auxiliary pixel electrode 210' may have an ITO/Ag/ITO-stacked structure.

A pixel-defining film 119 may cover an edge of each of the main pixel electrode 210 and the auxiliary pixel electrode 210' on the planarization layer 117, and may include a first opening OP1 and a second opening OP2, which expose at least a portion of the main pixel electrode 210 and at least a portion of the auxiliary pixel electrode 210', respectively. A size and shape of an emission area of the main organic light-emitting diode OLED, that is, the main sub-pixel Pm, may be defined according to the first opening OP1. A size and shape of an emission area of the auxiliary organic light-emitting diode OLED', that is, the auxiliary sub-pixel Pa, may be defined according to the second opening OP2.

The pixel-defining film 119 may prevent or substantially prevent an arc or the like from occurring on the edge of the main pixel electrode 210 by increasing a distance between the edge of the main pixel electrode 210 and an opposite electrode 230 above the main pixel electrode 210. In addition, the pixel-defining film 119 may prevent or substantially prevent an arc or the like from occurring on the edge of the auxiliary pixel electrode 210' by increasing a distance between the edge of the auxiliary pixel electrode 210' and the opposite electrode 230 above the auxiliary pixel electrode 210'.

The pixel-defining film 119 may include an organic insulation material, for example, such as a polyimide, polyamide, acryl resin, BCB, HMDSO, and/or phenol resin, and may be formed by a method such as spin coating.

A main emission layer 220b may be arranged in the first opening OP1 that exposes at least a portion of the main pixel electrode 210, and an auxiliary emission layer 220b' may be arranged in the second opening OP2 that exposes at least a portion of the auxiliary pixel electrode 210'. The main emission layer 220b and the auxiliary emission layer 220b' may include a polymer material or a small molecule material, and may emit red, green, blue, or white light.

An organic functional layer 220e may be arranged above and/or below the main emission layer 220b and the auxiliary emission layer 220b'. The organic functional layer 220e may include a first function layer 220a and/or a second functional layer 220c. The first function layer 220a and/or the second functional layer 220c may be omitted.

The first function layer 220a may be arranged below the main emission layer 220b and the auxiliary emission layer 220b'. The first function layer 220a may be a single layer or multiple layers including an organic material. For example, the first function layer 220a may be a hole transport layer (HTL) having a single-layered structure. In another example, the first function layer 220a may include a hole injection layer (HIL) and an HTL. The first function layer 220a may be integrally formed to correspond to the main organic light-emitting diode OLED included at (e.g., in or on) the main display area MDA and the auxiliary organic light-emitting diode OLED' included at (e.g., in or on) the component area CA.

The second functional layer 220c may be arranged on the main emission layer 220b and the auxiliary emission layer 220b'. The second functional layer 220c may be a single layer or multiple layers including an organic material. The second functional layer 220c may include an electron transport layer (ETL) and/or an electron injection layer (EIL). The second functional layer 220c may be formed to correspond to the main organic light-emitting diode OLED included at (e.g., in or on) the main display area MDA and the auxiliary organic light-emitting diode OLED' included at (e.g., in or on) the component area CA.

The opposite electrode 230 may be arranged on the second functional layer 220c. The opposite electrode 230 may include a conductive material with a low work function. For example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. As another example, the opposite electrode 230 may further include a layer, such as ITO, IZO, ZnO, or $In_2O_3$, on the (semi)transparent layer including one or more of any of the above-mentioned materials. The opposite electrode 230 may be formed to correspond to the main organic light-emitting diode OLED included at (e.g., in or on) the main display area MDA and the auxiliary organic light-emitting diode OLED' included at (e.g., in or on) the component area CA.

The layers from the main pixel electrode 210 to the opposite electrode 230, which are formed at (e.g., in or on) the main display area MDA, may constitute the main organic light-emitting diode OLED. The layers from the auxiliary pixel electrode 210' to the opposite electrode 230, which are formed at (e.g., in or on) the component area CA, may constitute the auxiliary organic light-emitting diode OLED'.

An upper layer 250 including an organic material may be arranged on the opposite electrode 230. The upper layer 250 may be a layer provided to protect the opposite electrode 230, and to improve light extraction efficiency at the same time. The upper layer 250 may include, for example, an organic material having a higher refractive index than that of the opposite electrode 230. In another example, the upper layer 250 may include stacked layers having different refractive indices. For example, the upper layer 250 may be provided by stacking a high refractive index layer/low refractive index layer/high refractive index layer. In this example, a refractive index of the high refractive index layer may be about 1.7 or more, and a refractive index of the low refractive index layer may be about 1.3 or less. The upper layer 250 may additionally include lithium fluoride (LiF). In another example, the upper layer 250 may additionally include an inorganic insulation material such as silicon oxide ($SiO_2$), silicon nitride ($SiN_x$), or silicon oxynitride ($SiO_xN_y$). In another embodiment, the upper layer 250 may be omitted.

The organic functional layer 220e, the opposite electrode 230, and the upper layer 250 may not be arranged at (e.g., in or on) the transmission area TA. For example, the organic functional layer 220e, the opposite electrode 230, and the upper layer 250 may be patterned by using a fine metal mask (FMM) or the like. In addition, after materials that form the organic functional layer 220e, the opposite electrode 230, and the upper layer 250 are formed on a full surface of the substrate 100, the organic functional layer 220e, the opposite electrode 230, and the upper layer 250, which are formed at (e.g., in or on) an area corresponding to the transmission area TA, may be removed by using a laser lift-off method. Thus, the organic functional layer 220e, the opposite electrode 230, and the upper layer 250 may not be arranged at (e.g., in or on) the transmission area TA. Accordingly, a light transmittance in the transmission area TA may be improved (e.g., may be significantly improved).

The main organic light-emitting diode OLED and the auxiliary organic light-emitting diode OLED' may be sealed by the thin-film encapsulation layer 300. The thin-film encapsulation layer 300 may be arranged on the upper layer 250. The thin-film encapsulation layer 300 may prevent or substantially prevent external moisture and/or foreign substances from penetrating into the main organic light-emitting diode OLED and the auxiliary organic light-emitting diode OLED'.

The thin-film encapsulation layer 300 may include at least one inorganic encapsulation layer and at least one organic encapsulation layer. In this regard, FIG. 4 illustrates a structure of the thin-film encapsulation layer 300, in which the first inorganic encapsulation layer 310, the organic encapsulation layer 320, and the second inorganic encapsulation layer 330 are stacked. In another embodiment, the number of organic encapsulation layers, the number of inorganic encapsulation layers, and a stacking order may be variously modified.

The first inorganic encapsulation layer 310 and the second inorganic encapsulation layer 330 may include at least one inorganic insulation material, for example, such as aluminum oxide, titanium oxide, tantalum oxide, hafnium oxide, zinc oxide, silicon oxide, silicon nitride, or silicon oxynitride, and may be formed by a chemical vapor deposition (CVD) method. The organic encapsulation layer 320 may include a polymer-based material. Examples of the polymer-based material may include silicon-based resin, acryl-based resin, epoxy-based resin, polyimide, and polyethylene.

The first inorganic encapsulation layer 310, the organic encapsulation layer 320, and the second inorganic encapsulation layer 330 may be integrally formed to cover the main display area MDA and the component area CA. Accordingly, the first inorganic encapsulation layer 310, the organic encapsulation layer 320, and the second inorganic encapsulation layer 330 may be arranged above the planarization layer 117 arranged above the transmission area TA.

In another embodiment, the organic encapsulation layer 320 may be integrally formed to cover the main display area MDA and the component area CA, and may not be at (e.g., in or on) the transmission area TA. In other words, the organic encapsulation layer 320 may include an opening corresponding to the transmission area TA. In this case, the first inorganic encapsulation layer 310 may contact the second inorganic encapsulation layer 330 at (e.g., in or on) the transmission area TA.

Figure 5:
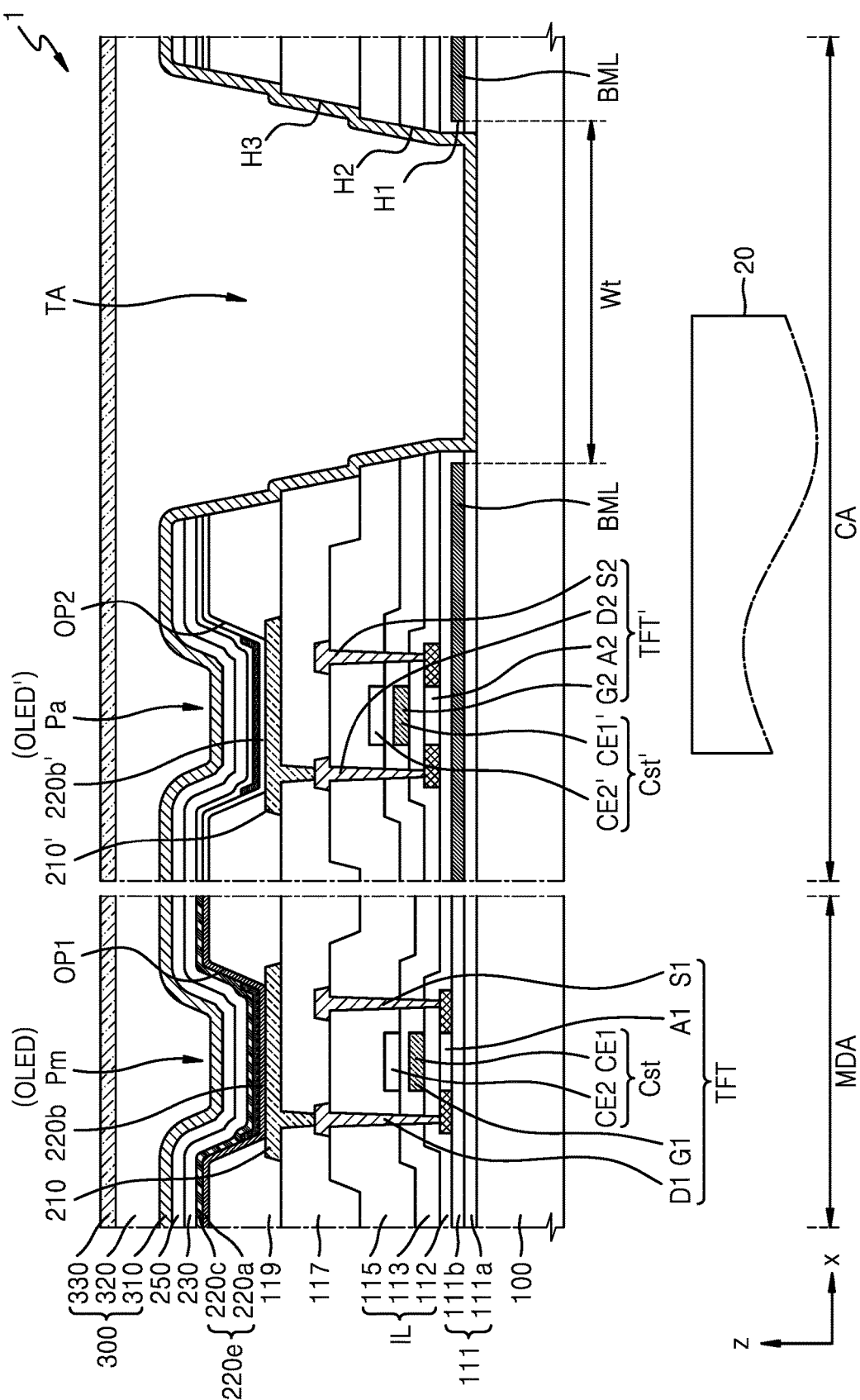
FIG. 5 is a schematic cross-sectional view of a display apparatus, according to an embodiment.

FIG. 5 is a schematic cross-sectional view of a display apparatus, according to an embodiment. In FIG. 5, the same reference numerals as those in FIG. 4 denote the same or substantially the same elements, and thus, the differences therebetween may be mainly described and redundant descriptions thereof may not be repeated.

Referring to FIG. 5, the planarization layer 117 may have a third hole H3 corresponding to the transmission area TA. The third hole H3 may overlap with the second hole H2. Although FIG. 5 illustrates that the third hole H3 is greater than (e.g., has a larger opening than that of) the second hole H2, the present disclosure is not limited thereto. For example, in another embodiment, the planarization layer 117 may be provided to cover an edge of the second hole H2 of the inorganic insulating layer IL, and thus, an area of the third hole H3 may be less than an area of the second hole H2.

In an embodiment, the first inorganic encapsulation layer 310 of the thin-film encapsulation layer 300 may be arranged directly on the substrate 100 at (e.g., in or on) the transmission area TA. In another embodiment, when the first buffer layer 111a corresponding to the transmission area TA is not removed, the first inorganic encapsulation layer 310 of the thin-film encapsulation layer 300 may be arranged on the first buffer layer 111a at (e.g., in or on) the transmission area TA.

In addition, when the organic encapsulation layer 320 is integrally formed to cover the main display area MDA and the component area CA and is not in the transmission area TA, the first inorganic encapsulation layer 310 may contact the second inorganic encapsulation layer 330 in the transmission area TA.

Figure 6:
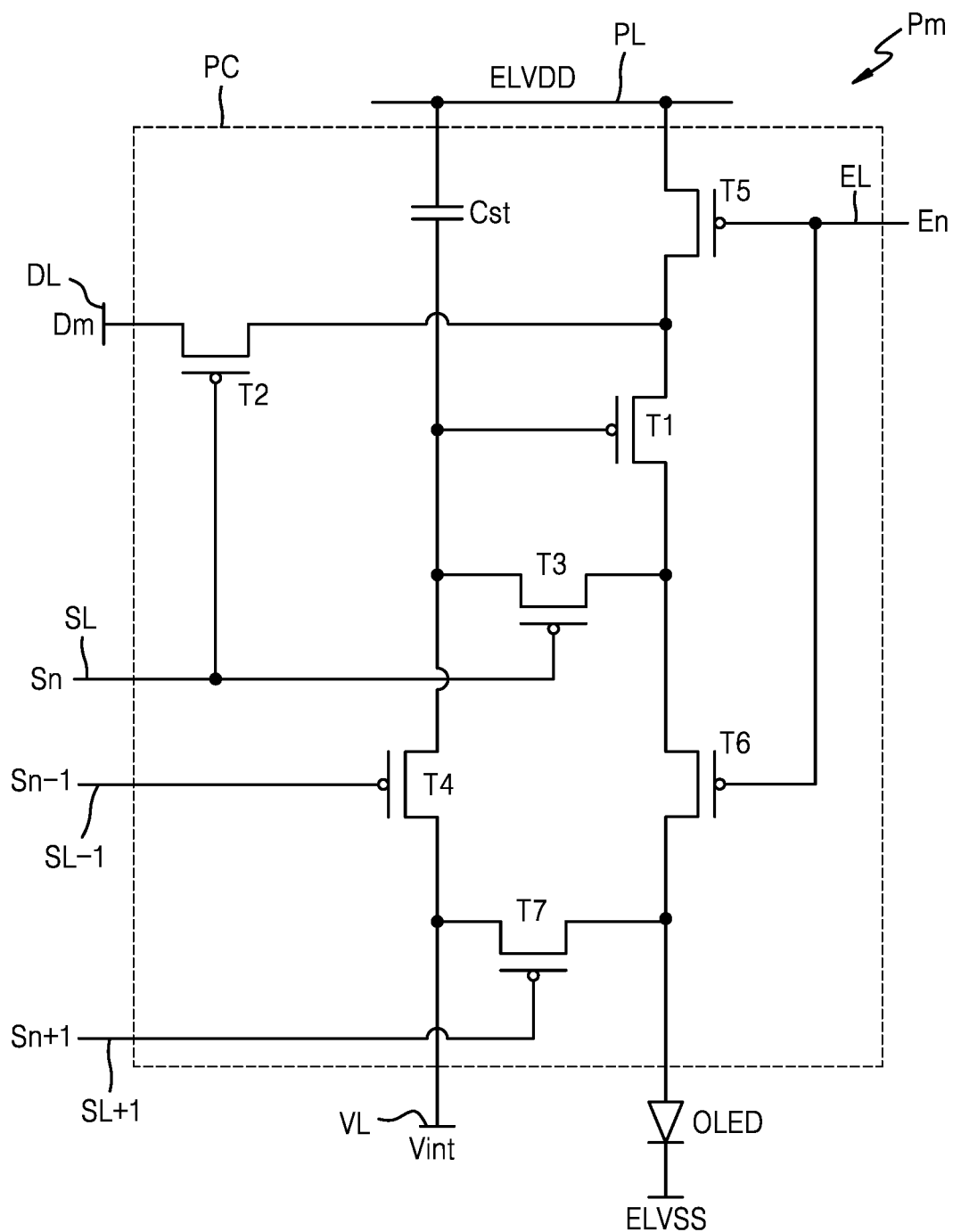
FIG. 6 is an equivalent circuit diagram of a sub-pixel which may be included in a display apparatus, according to an embodiment.

FIG. 6 is an equivalent circuit diagram of a sub-pixel which may be included in a display apparatus, according to an embodiment.

In FIG. 6, a pixel circuit is shown corresponding to a main pixel circuit PC of the main sub-pixel Pm, and an auxiliary pixel circuit PC' of the auxiliary sub-pixel Pa may be the same or substantially the same as (e.g., identical to) or different from the main pixel circuit PC of the main sub-pixel Pm.

Referring to FIG. 6, the main sub-pixel Pm may include the main pixel circuit PC. The main pixel circuit PC may include a main driving thin-film transistor T1, a switching thin-film transistor T2, a compensating thin-film transistor T3, a first main initializing thin-film transistor T4, an operation control thin-film transistor T5, a light-emission control thin-film transistor T6, a second main initializing thin-film transistor T7, and a storage capacitor Cst.

Although FIG. 6 illustrates a case where signal lines SL, SL−1, SL+1, EL, and DL (also referred to as the scan line SL, a previous scan line SL−1, a post scan line SL+1, the light-emission control line EL, and the data line DL, respectively), an initializing voltage line VL, and the driving voltage line PL are provided for each main pixel circuit PC, the present disclosure is not limited thereto. In another embodiment, at least one of the signal lines SL, SL−1, SL+1, EL, and DL and/or the initializing voltage line VL may be shared by one or more adjacent (e.g., one or more neighboring) pixel circuits.

Any one electrode of the storage capacitor Cst may be connected to a gate electrode of the main driving thin-film transistor T1, a drain electrode of the compensating thin-film transistor T3, and a main source electrode of the first main initializing thin-film transistor T4. The other electrode of the storage capacitor Cst may be connected to the driving voltage line PL.

A drain electrode of the main driving thin-film transistor T1 may be electrically connected to the main organic light-emitting diode OLED through the light-emission control thin-film transistor T6. The main driving thin-film transistor T1 may supply a driving current to the main organic light-emitting diode OLED by receiving a data signal Dm according to a switching operation of the switching thin-film transistor T2.

A gate electrode of the switching thin-film transistor T2 may be connected to the scan line SL, and a source electrode of the switching thin-film transistor T2 may be connected to the data line DL. A drain electrode of the switching thin-film transistor T2 may be connected to a source electrode of the main driving thin-film transistor T1, and may be connected to the driving voltage line PL through the operation control thin-film transistor T5.

The switching thin-film transistor T2 may be turned on according to a scan signal Sn received via the scan line SL, and may perform a switching operation of transmitting the data signal Dm transmitted through the data line DL to the source electrode of the main driving thin-film transistor T1.

A gate electrode of the compensating thin-film transistor T3 may be connected to the scan line SL. A source electrode of the compensating thin-film transistor T3 may be connected to the drain electrode of the main driving thin-film transistor T1, and may be connected to the main pixel electrode 210 (in FIG. 4) of the main organic light-emitting diode OLED through the light-emission control thin-film transistor T6. The drain electrode of the compensating thin-film transistor T3 may be connected to any one electrode of the storage capacitor Cst, the main source electrode of the first main initializing thin-film transistor T4, and the gate electrode of the main driving thin-film transistor T1. The compensating thin-film transistor T3 may be turned on according to the scan signal Sn received via the scan line SL to diode-connect the main driving thin-film transistor T1 by connecting the gate electrode of the main driving thin-film transistor T1 to the drain electrode of the main driving thin-film transistor T1.

A gate electrode of the first main initializing thin-film transistor T4 may be connected to the previous scan line SL−1. A main drain electrode of the first main initializing thin-film transistor T4 may be connected to the initializing voltage line VL. The main source electrode of the first main initializing thin-film transistor T4 may be connected to any one electrode of the storage capacitor Cst, the drain electrode of the compensating thin-film transistor T3, and the gate electrode of the main driving thin-film transistor T1. The first main initializing thin-film transistor T4 may be turned on according to a previous scan signal Sn−1 received via the previous scan line SL−1, and may perform an initializing operation of initializing a voltage of the gate electrode of the main driving thin-film transistor T1 by transmitting an initializing voltage Vint to the gate electrode of the main driving thin-film transistor T1.

A gate electrode of the operation control thin-film transistor T5 may be connected to the light-emission control line EL. A source electrode of the operation control thin-film transistor T5 may be connected to the driving voltage line PL. A drain electrode of the operation control thin-film transistor T5 is connected to the source electrode of the main driving thin-film transistor T1 and the drain electrode of the switching thin-film transistor T2.

A gate electrode of the light-emission control thin-film transistor T6 may be connected to the light-emission control line EL. A source electrode of the light-emission control thin-film transistor T6 may be connected to the drain electrode of the main driving thin-film transistor T1 and the source electrode of the compensating thin-film transistor T3. A drain electrode of the light-emission control thin-film transistor T6 may be electrically connected to the main pixel electrode 210 (in FIG. 4) of the main organic light-emitting diode OLED. The operation control thin-film transistor T5 and the light-emission control thin-film transistor T6 may be concurrently (e.g., simultaneously) turned on according to a light-emission control signal En received via the light-emission control line EL, the driving voltage ELVDD may be transmitted to the main organic light-emitting diode OLED, and a driving current may flow to the main organic light-emitting diode OLED.

A gate electrode of the second main initializing thin-film transistor T7 may be connected to the post scan line SL+1. A main source electrode of the second main initializing thin-film transistor T7 may be connected to the main pixel electrode 210 (in FIG. 4) of the main organic light-emitting diode OLED. A main drain electrode of the second main initializing thin-film transistor T7 may be connected to the initializing voltage line VL. The second main initializing thin-film transistor T7 may be turned on according to a post scan signal Sn+1 received via the post scan line SL+1, and thus, may initialize the main pixel electrode 210 (in FIG. 4) of the main organic light-emitting diode OLED.

Although FIG. 6 illustrates a case where the first main initializing thin-film transistor T4 and the second main initializing thin-film transistor T7 are connected to the previous scan line SL−1 and the post scan line SL+1, respectively, the present disclosure is not limited thereto. In another embodiment, both the first main initializing thin-film transistor T4 and the second main initializing thin-film transistor T7 may be connected to the previous scan line SL−1, and thus, may be driven according to the previous scan signal Sn−1.

Any one electrode of the storage capacitor Cst may be connected to the gate electrode of the main driving thin-film transistor T1, the drain electrode of the compensating thin-film transistor T3, and the main source electrode of the first main initializing thin-film transistor T4. The other electrode of the storage capacitor Cst may be connected to the driving voltage line PL.

An opposite electrode (for example, a cathode) of the main organic light-emitting diode OLED receives the common voltage ELVSS. The main organic light-emitting diode OLED emits light by receiving the driving current from the main driving thin-film transistor T1.

Figure 7:
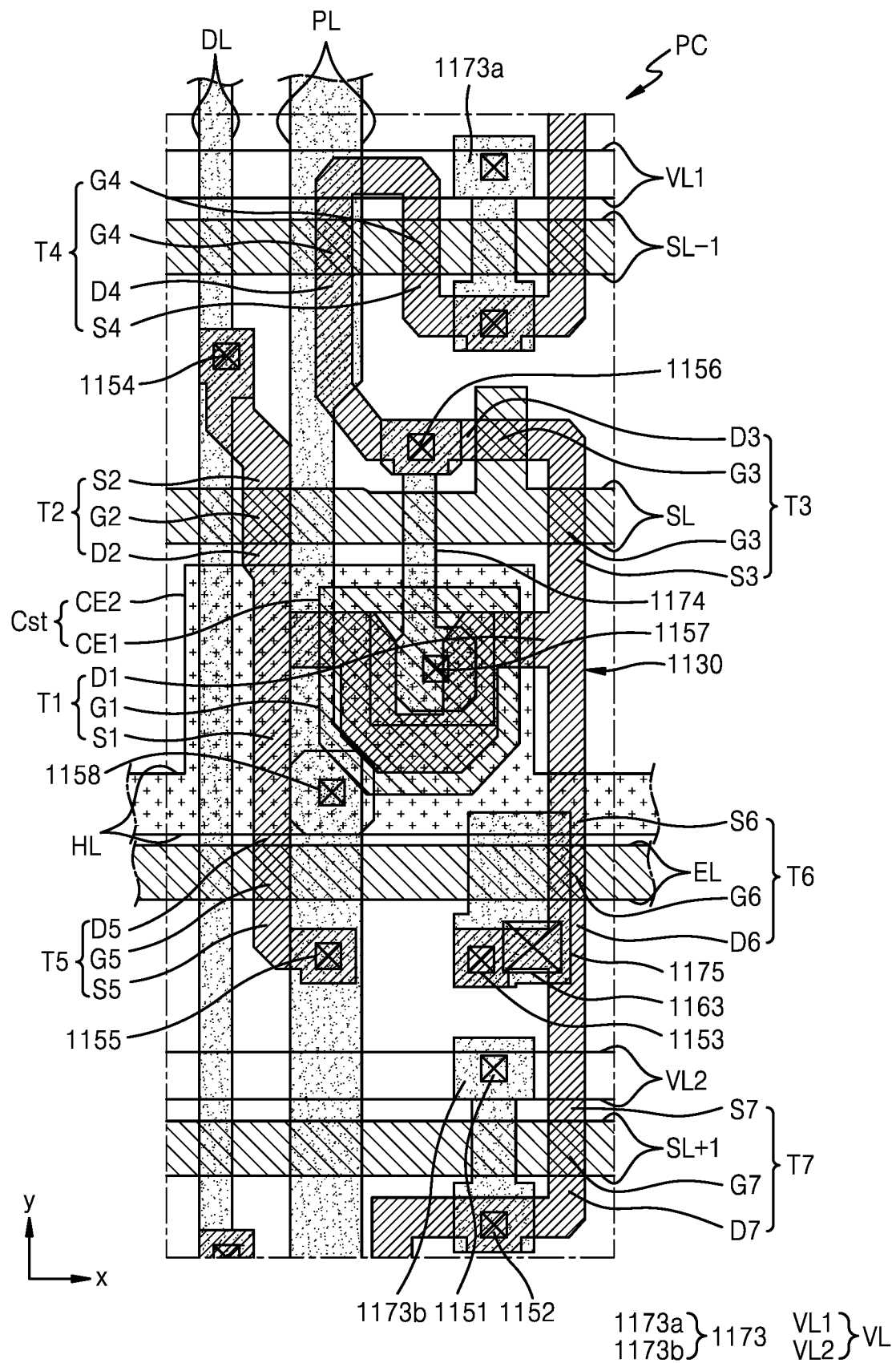
FIG. 7 is a schematic top plan view of a structure of a pixel circuit which may be included in a display apparatus, according to an embodiment.

FIG. 7 is a schematic top plan view of a structure of a pixel circuit which may be included in a display apparatus, according to an embodiment.

Referring to FIG. 7, the main driving thin-film transistor T1, the switching thin-film transistor T2, the compensating thin-film transistor T3, the first main initializing thin-film transistor T4, the operation control thin-film transistor T5, the light-emission control thin-film transistor T6, and the second main initializing thin-film transistor T7 may be arranged along a main semiconductor layer 1130. Some areas of the main semiconductor layer 1130 may include semiconductor layers of the main driving thin-film transistor T1, the switching thin-film transistor T2, the compensating thin-film transistor T3, the first main initializing thin-film transistor T4, the operation control thin-film transistor T5, the light-emission control thin-film transistor T6, and the second main initializing thin-film transistor T7. The main semiconductor layer 1130 is arranged above the substrate 100 (in FIG. 4) on which the buffer layer 111 (in FIG. 4), which is an inorganic insulation material, is formed.

Some areas of the main semiconductor layer 1130 correspond to the semiconductor layers of the main driving thin-film transistor T1, the switching thin-film transistor T2, the compensating thin-film transistor T3, the first main initializing thin-film transistor T4, the operation control thin-film transistor T5, the light-emission control thin-film transistor T6, and the second main initializing thin-film transistor T7. In other words, the semiconductor layers of the main driving thin-film transistor T1, the switching thin-film transistor T2, the compensating thin-film transistor T3, the first main initializing thin-film transistor T4, the operation control thin-film transistor T5, the light-emission control thin-film transistor T6, and the second main initializing thin-film transistor T7 may be understood as being connected to each other and curved in various suitable shapes.

The main semiconductor layer 1130 includes a channel area, and a source area and a drain area at opposite sides of the channel area. The source area and the drain area may be understood as a source electrode and a drain electrode, respectively, of a corresponding thin-film transistor. Hereinafter, for convenience, the source area and the drain area are referred to as the source electrode and the drain electrode, respectively.

The main driving thin-film transistor T1 includes a driving gate electrode G1 overlapping with a driving channel area, and a driving source electrode S1 and a driving drain electrode D1 at opposite sides of the driving channel area. The driving channel area overlapping with the driving gate electrode G1 has a bent shape, for example, such as an omega shape so that a long channel length may be formed in a narrow space. When the driving channel area is long in length, a driving range of a gate voltage may increase, such that gradation of light emitted from the main organic light-emitting diode OLED (in FIG. 6), which is a light-emitting device, may be further precisely controlled, and thus, a display quality may be improved.

The switching thin-film transistor T2 includes a switching gate electrode G2 overlapping a switching channel area, and a switching source electrode S2 and a switching drain electrode D2 at opposite sides of the switching channel area. The switching drain electrode D2 may be connected to the driving source electrode S1.

The compensating thin-film transistor T3 is a dual thin-film transistor, and may include compensating gate electrodes G3 overlapping with two compensating channel areas, and a compensating source electrode S3 and a compensating drain electrode D3 arranged at opposite sides of the compensating gate electrodes G3. The compensating thin-film transistor T3 may be connected to the driving gate electrode G1 of the main driving thin-film transistor T1 via a node connecting line 1174, which will be described in more detail below.

The first main initializing thin-film transistor T4 is a dual thin-film transistor, and may include a first initializing gate electrode G4 overlapping with two first main initializing channel areas, and a first initializing source electrode S4 and a first main initializing drain electrode D4 at opposite sides of the first initializing gate electrode G4.

The operation control thin-film transistor T5 may include an operation control gate electrode G5 overlapping with an operation control channel area, and an operation control source electrode S5 and an operation control drain electrode D5 at opposite sides of the operation control gate electrode G5. The operation control drain electrode D5 may be connected to the driving source electrode S1.

The light-emission control thin-film transistor T6 may include a light-emission control gate electrode G6 overlapping with a light-emission control channel area, and a light-emission control source electrode S6 and a light-emission control drain electrode D6 at opposite sides of the light-emission control gate electrode G6. The light-emission control source electrode S6 may be connected to the driving drain electrode D1.

The second main initializing thin-film transistor T7 may include a second initializing gate electrode G7 overlapping with a second initializing channel area, and a second main initializing source electrode S7 and a second main initializing drain electrode D7 at opposite sides of the second initializing gate electrode G7.

The aforementioned thin-film transistors may be connected to the signal lines SL, SL−1, EL, and DL, a first initializing voltage line VL1, a second initializing voltage line VL2, and the driving voltage line PL.

The scan line SL, the previous scan line SL−1, the light-emission control line EL, and the driving gate electrode G1 may be arranged on the main semiconductor layer 1130 with insulating layer(s) therebetween.

The scan line SL may extend in an x direction. Some areas of the scan line SL may correspond to the switching gate electrode G2 and a compensating gate electrode G3. For example, areas of the scan line SL that overlap with channel areas of the switching thin-film transistor T2 and the compensating thin-film transistor T3 may be the switching gate electrode G2 and the compensating gate electrode G3, respectively.

The previous scan line SL−1 may extend in the x direction, and some areas thereof may correspond to the first initializing gate electrode G4 and the second initializing gate electrode G7, respectively. For example, areas of the previous scan line SL−1 that overlap with channel areas of the first main initializing thin-film transistor T4 and the second main initializing thin-film transistor T7 may be the first main initializing gate electrode G4 and the second main initializing gate electrode G7, respectively.

The light-emission control line EL may extend in the x direction. Some areas of the light-emission control line EL may correspond to the operation control gate electrode G5 and the light-emission control gate electrode G6, respectively. For example, areas of the light-emission control line EL that overlap with channel areas of the operation control thin-film transistor T6 and the light-emission control thin-film transistor T7 may be the operation control gate electrode G5 and the light-emission control gate electrode G6, respectively.

The driving gate electrode G1 is a floating electrode, and may be connected to the compensating thin-film transistor T3 via the node connecting line 1174.

An electrode voltage line HL and initializing voltage lines VL1 and VL2 (also referred to as a first initializing voltage line VL1 and a second initializing voltage line VL2, respectively) may be arranged above the scan line SL, the previous scan line SL−1, the light-emission control line EL, and the driving gate electrode G1 with insulating layer(s) therebetween.

The electrode voltage line HL may extend in the x direction to cross the data line DL and the driving voltage line PL. A portion of the electrode voltage line HL may cover at least a portion of the driving gate electrode G1, and may form the storage capacitor Cst, together with the driving gate electrode G1. For example, the driving gate electrode G1 may be a lower electrode CE1 of the storage capacitor Cst, and a portion of the electrode voltage line HL may be an upper electrode CE2 of the storage capacitor Cst.

The upper electrode CE2 of the storage capacitor Cst is electrically connected to the driving voltage line PL. In this regard, the electrode voltage line HL may be connected to the driving voltage line PL arranged above the electrode voltage line HL via a contact hole 1158. Accordingly, the electrode voltage line HL may have the same or substantially the same voltage level (e.g., a constant voltage) as that of the driving voltage line PL. For example, the electrode voltage line HL may have a constant or substantially constant voltage of +5V. The electrode voltage line HL may be understood as a horizontal driving voltage line.

The driving voltage line PL may extend in a y direction, and the electrode voltage line HL electrically connected to the driving voltage line PL may extend in the x direction crossing the y direction, and thus, a plurality of driving voltage lines PL and electrode voltage lines HL may form a mesh structure.

The first initializing voltage line VL1 may be connected to the first main initializing thin-film transistor T4 via a first initializing connection line 1173a, and the second initializing voltage line VL2 may be connected to the second main initializing thin-film transistor T7 via a second initializing connection line 1173b. In addition, the first initializing voltage line VL1 and the second initializing voltage line VL2 may be connected to each other by using a connecting member, and may have a constant or substantially constant voltage (for example, −2V).

The data line DL, the driving voltage line PL, an initializing connection line 1173, and the node connecting line 1174 may be arranged above the electrode voltage line HL with insulating layer(s) therebetween.

The data line DL may extend in the y direction, and may be connected to the switching source electrode S2 of the switching thin-film transistor T2 via a contact hole 1154. A portion of the data line DL may be understood as a switching source electrode.

The driving voltage line PL may extend in the y direction, and may be connected to the electrode voltage line HL via the contact hole 1158 as described above. In addition, the driving voltage line PL may be connected to the operation control thin-film transistor T5 via a contact hole 1155. The driving voltage line PL may be connected to the operation control source electrode S5 via the contact hole 1155.

One end of the initializing connection line 1173 may be connected to the first and second initializing thin-film transistors T4 and T7 via a contact hole 1152, and the other end thereof may be connected to the initializing voltage line VL, which will be described in more detail below, via a contact hole 1151.

One end of the node connecting line 1174 may be connected to the compensating drain electrode D3 via a contact hole 1156, and the other end thereof may be connected to the driving gate electrode G1 via a contact hole 1157.

Figure 8:
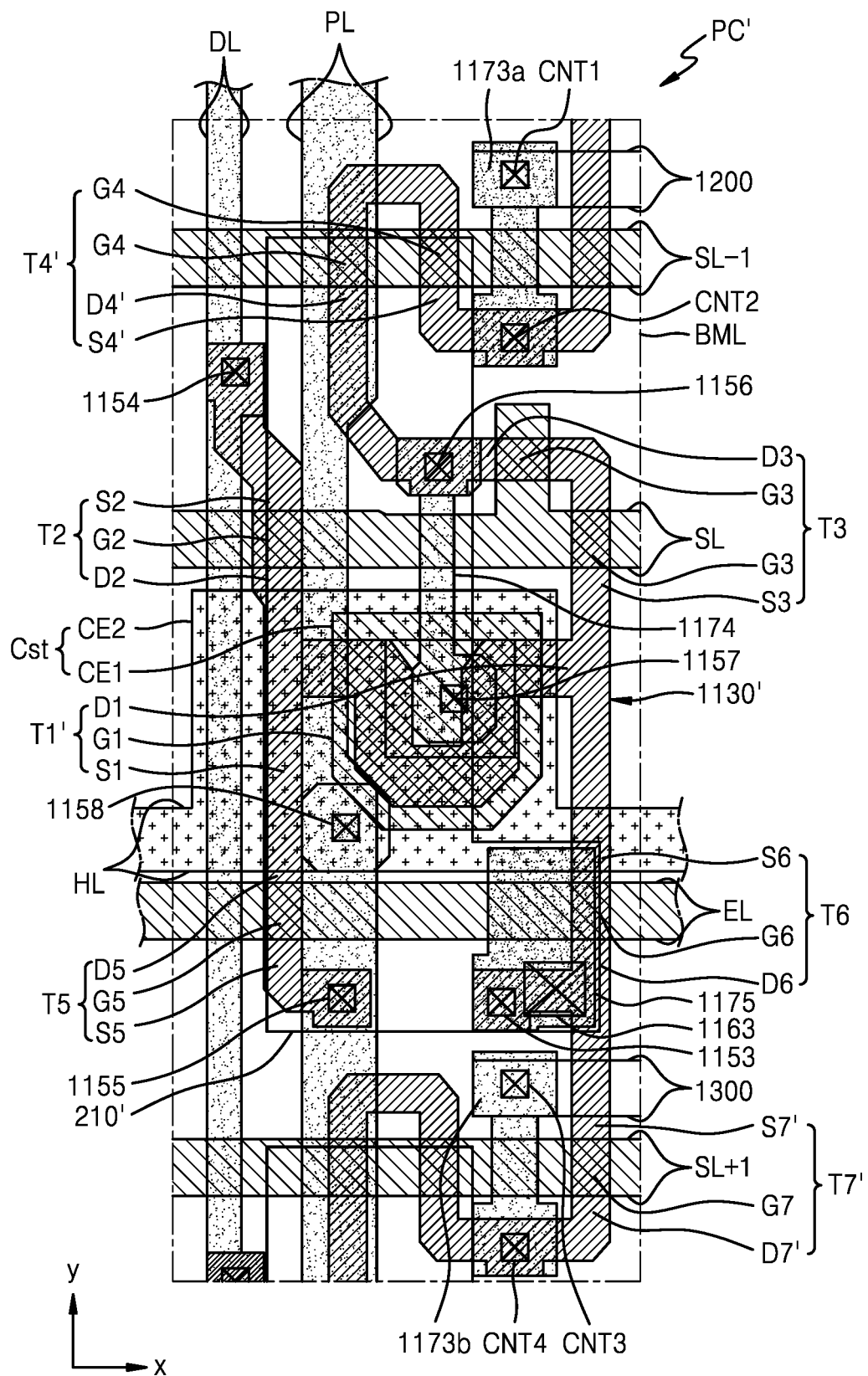
FIG. 8 is a schematic top plan view of a structure of a pixel circuit which may be included in a display apparatus, according to an embodiment.

FIG. 8 is a schematic top plan view of a structure of a pixel circuit which may be included in a display apparatus, according to an embodiment. In FIG. 8, the same reference numerals as those in FIG. 7 denote the same or substantially the same elements, and thus, differences therebetween will be mainly described and redundant descriptions thereof may not be repeated.

Referring to FIG. 8, the auxiliary pixel circuit PC' may include an auxiliary driving thin-film transistor T1', the switching thin-film transistor T2, the compensating thin-film transistor T3, a first auxiliary initializing thin-film transistor T4', the operation control thin-film transistor T5, the light-emission control thin-film transistor T6, and a second auxiliary initializing thin-film transistor T7'. The auxiliary driving thin-film transistor T1', the switching thin-film transistor T2, the compensating thin-film transistor T3, the first auxiliary initializing thin-film transistor T4', the operation control thin-film transistor T5, the light-emission control thin-film transistor T6, and the second auxiliary initializing thin-film transistor T7' may be arranged along an auxiliary semiconductor layer 1130'. Some areas of the auxiliary semiconductor layer 1130' may correspond to semiconductor layers of the auxiliary driving thin-film transistor T1', the switching thin-film transistor T2, the compensating thin-film transistor T3, the first auxiliary initializing thin-film transistor T4', the operation control thin-film transistor T5, the light-emission control thin-film transistor T6, and the second auxiliary initializing thin-film transistor T7'. The auxiliary semiconductor layer 1130' may be arranged above the substrate 100 (in FIG. 4) on which the buffer layer 111 (in FIG. 4), which is an inorganic insulation material, is formed.

Some areas of the auxiliary semiconductor layer 1130' may correspond to semiconductor layers of the auxiliary driving thin-film transistor T1', the switching thin-film transistor T2, the compensating thin-film transistor T3, the first auxiliary initializing thin-film transistor T4', the operation control thin-film transistor T5, the light-emission control thin-film transistor T6, and the second auxiliary initializing thin-film transistor T7'. In other words, the semiconductor layers of the auxiliary driving thin-film transistor T1', the switching thin-film transistor T2, the compensating thin-film transistor T3, the first auxiliary initializing thin-film transistor T4', the operation control thin-film transistor T5, the light-emission control thin-film transistor T6, and the second auxiliary initializing thin-film transistor T7' may be understood as being connected to each other and curved in various suitable shapes.

The first auxiliary initializing thin-film transistor T4' may include the first initializing gate electrode G4 overlapping with a first initializing channel area, and a first auxiliary initializing source electrode S4' and a first auxiliary initializing drain electrode D4' at opposite sides of the first initializing gate electrode G4.

The second auxiliary initializing thin-film transistor T7' may include the second initializing gate electrode G7 overlapping with the second initializing channel area, and a second auxiliary initializing source electrode S7' and a second auxiliary initializing drain electrode D7' at opposite sides of the second initializing gate electrode G7.

The auxiliary pixel circuit PC' may include a first wire 1200, a second wire 1300, the first initializing connection line 1173a, and the second initializing connection line 1173b.

The first wire 1200 may be electrically connected to the first initializing connection line 1173a via a first contact hole CNT1, and the first initializing connection line 1173a may be electrically connected to the auxiliary semiconductor layer 1130' via a second contact hole CNT2. Accordingly, the first wire 1200 may be electrically connected to the auxiliary semiconductor layer 1130'.

The second wire 1300 may be electrically connected to the second initializing connection line 1173b via a third contact hole CNT3, and the second initializing connection line 1173b may be electrically connected to the auxiliary semiconductor layer 1130' via a fourth contact hole CNT4. Accordingly, the second wire 1300 may be electrically connected to the auxiliary semiconductor layer 1130'.

Figure 9:
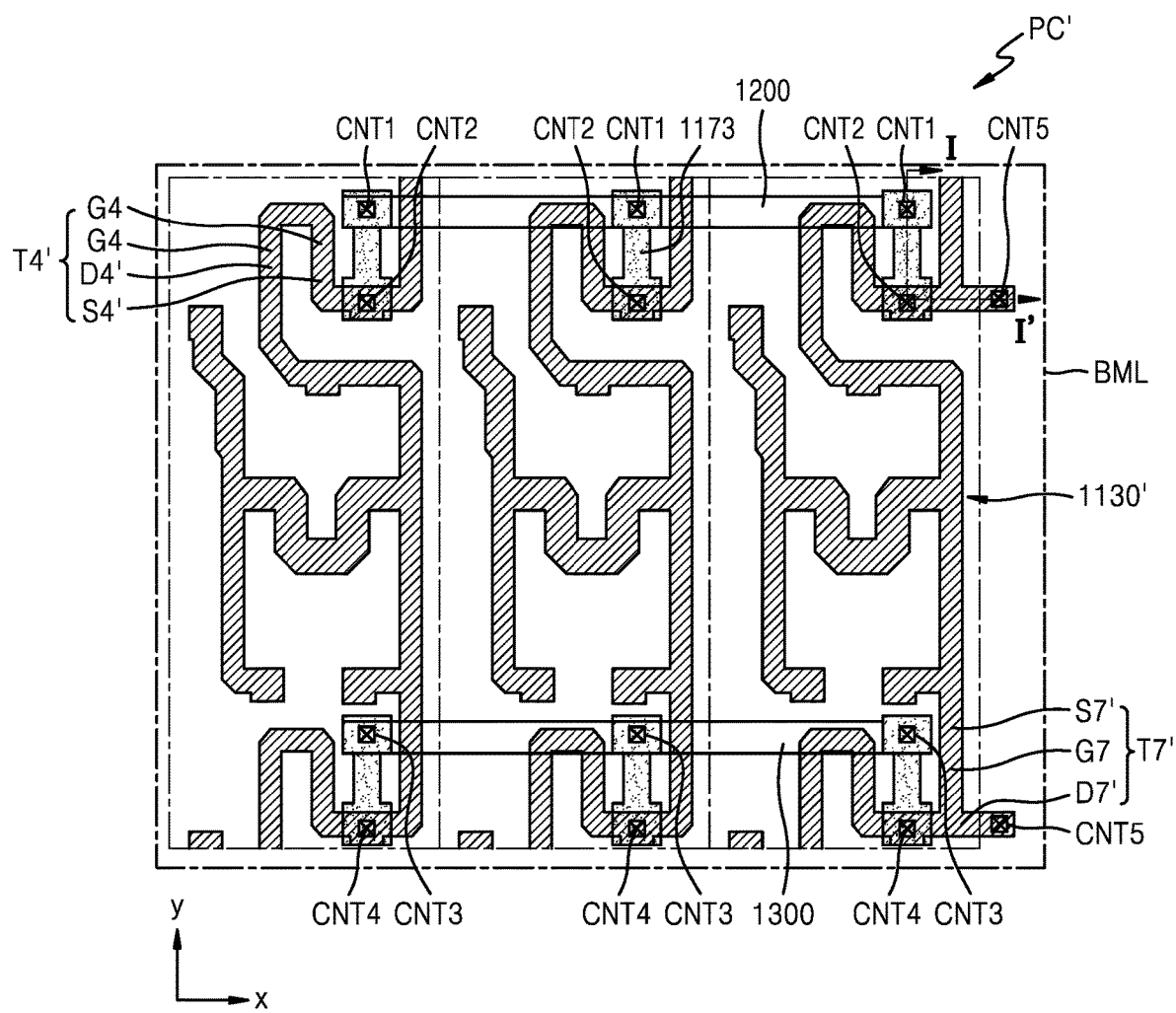
FIG. 9 is a schematic top plan view of a display apparatus, according to an embodiment.
Figure 10:
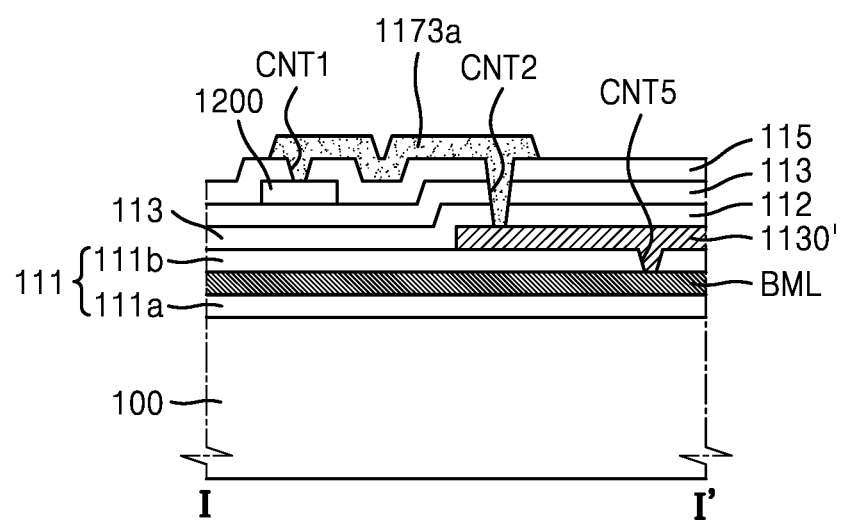
FIG. 10 is a schematic cross-sectional view of a display apparatus, according to an embodiment.

FIG. 9 is a schematic top plan view of a display apparatus, according to an embodiment, and FIG. 10 is a schematic cross-sectional view of a display apparatus, according to an embodiment. In more detail, FIG. 9 is a view illustrating that an initializing voltage is applied to the first auxiliary initializing thin-film transistor T4' and the second auxiliary initializing thin-film transistor T7' via the first wire 1200 and the second wire 1300, and FIG. 10 corresponds to a cross-sectional view of the display apparatus taken along the line I-I' of FIG. 9.

Referring to FIGS. 9 and 10, the bottom metal layer BML may be arranged under the auxiliary pixel circuit PC'. In FIG. 9, although three auxiliary pixel circuits PC' are adjacently arranged in the x direction, the present disclosure is not limited thereto. Various suitable numbers of auxiliary pixel circuits PC' (for example, two or four auxiliary pixel circuits PC') may be adjacently arranged in the x direction or the y direction, or may be adjacently arranged in the x direction and the y direction.

Among the three auxiliary pixel circuits PC' in FIG. 9, when an auxiliary pixel circuit PC' arranged on the left is referred to as a first auxiliary pixel circuit, an auxiliary pixel circuit PC' arranged in the middle is referred to as a second auxiliary pixel circuit, and an auxiliary pixel circuit PC' arranged on the right is referred to as a third auxiliary pixel circuit. The auxiliary semiconductor layer 1130' of the third auxiliary pixel circuit may be electrically connected to the bottom metal layer BML via a fifth contact hole CNT5. In more detail, at least a portion of the auxiliary semiconductor layer 1130' may extend in the x direction, and the auxiliary semiconductor layer 1130' extending in the x direction may be electrically connected to the bottom metal layer BML arranged thereunder via the fifth contact hole CNT5 defined by the second buffer layer 111b. The auxiliary semiconductor layer 1130' and the bottom metal layer BML may be electrically connected to each other, and the auxiliary semiconductor layer 1130' may have the same or substantially the same constant voltage as that of the bottom metal layer BML.

The auxiliary semiconductor layer 1130' may be electrically connected to the first initializing connection line 1173a via the second contact hole CNT2. In more detail, the auxiliary semiconductor layer 1130' may be electrically connected to the first initializing connection line 1173a via the second contact hole CNT2 defined by the first insulating layer 112, the second insulating layer 113, and the third insulating layer 115. The bottom metal layer BML and the auxiliary semiconductor layer 1130' may be electrically connected to each other, and the auxiliary semiconductor layer 1130' and the first initializing connection line 1173a may be electrically connected to each other, and thus, the bottom metal layer BML and the first initializing connection line 1173a may be electrically connected to each other.

The first initializing connection line 1173a may be arranged by extending in the y direction. The first initializing connection line 1173a may be electrically connected to the first wire 1200 via the first contact hole CNT1. In more detail, the first initializing connection line 1173a may be electrically connected to the first wire 1200 via the first contact hole CNT1 defined by the third insulating layer 115. The bottom metal layer BML and the auxiliary semiconductor layer 1130' may be electrically connected to each other, the auxiliary semiconductor layer 1130' and the first initializing connection line 1173a may be electrically connected to each other, and the first initializing connection line 1173a and the first wire 1200 may be electrically connected to each other, and thus, the bottom metal layer BML and the first wire 1200 may be electrically connected to each other. Accordingly, the first wire 1200 may have the same or substantially the same constant voltage as the bottom metal layer BML.

The first wire 1200 may be arranged by extending in the x direction. The first wire 1200 electrically connected to the bottom metal layer BML may be arranged by extending toward the first auxiliary pixel circuit and the second auxiliary pixel circuit, which are adjacent to the first wire 1200. The first wire 1200 extending toward the first auxiliary pixel circuit and the second auxiliary pixel circuit may be electrically connected to the first initializing connection line 1173a via the first contact hole CNT1, and the first initializing connection line 1173a may be electrically connected to the auxiliary semiconductor layer 1130' via the second contact hole CNT2, and thus, the same or substantially the same constant voltage as that of the bottom metal layer BML may be applied to the first auxiliary pixel circuit and the second auxiliary pixel circuit.

Such a structure may be applied to the second auxiliary initializing thin-film transistor T7' arranged on a lower side of the auxiliary pixel circuit PC'.

Each of the three auxiliary pixel circuits PC' is not directly connected to the bottom metal layer BML via a contact hole, but one auxiliary pixel circuit (e.g., the third auxiliary pixel circuit) PC' is electrically connected to the bottom metal layer BML via the contact hole (e.g., CNT5), and an initializing voltage is transmitted to an auxiliary pixel circuit PC' next to the one auxiliary pixel circuit PC' via the first wire 1200 extending in the x direction and the second wire 1300, and thus, a size of the transmission area TA may be extended.

As will be described in more detail below with reference to FIG. 15, the bottom metal layer BML may be electrically connected to the initializing voltage line VL for transmitting an initializing voltage to the main pixel circuit PC, and thus, the bottom metal layer BML may have a constant or substantially constant voltage corresponding to the initializing voltage. The bottom metal layer BML may be electrically connected to the auxiliary semiconductor layer 1130' of the auxiliary pixel circuit PC', and thus, the constant voltage corresponding to the initializing voltage may be applied to the auxiliary pixel circuit PC'. Accordingly, the first auxiliary initializing thin-film transistor T4' may perform an operation of initializing a voltage of a gate electrode of the auxiliary driving thin-film transistor T1' by transmitting the initializing voltage to the gate electrode of the auxiliary driving thin-film transistor T1'. In addition, the second auxiliary initializing thin-film transistor T7' may initialize the auxiliary pixel electrode 210' of the auxiliary organic light-emitting diode OLED' (in FIG. 7).

Figure 11:
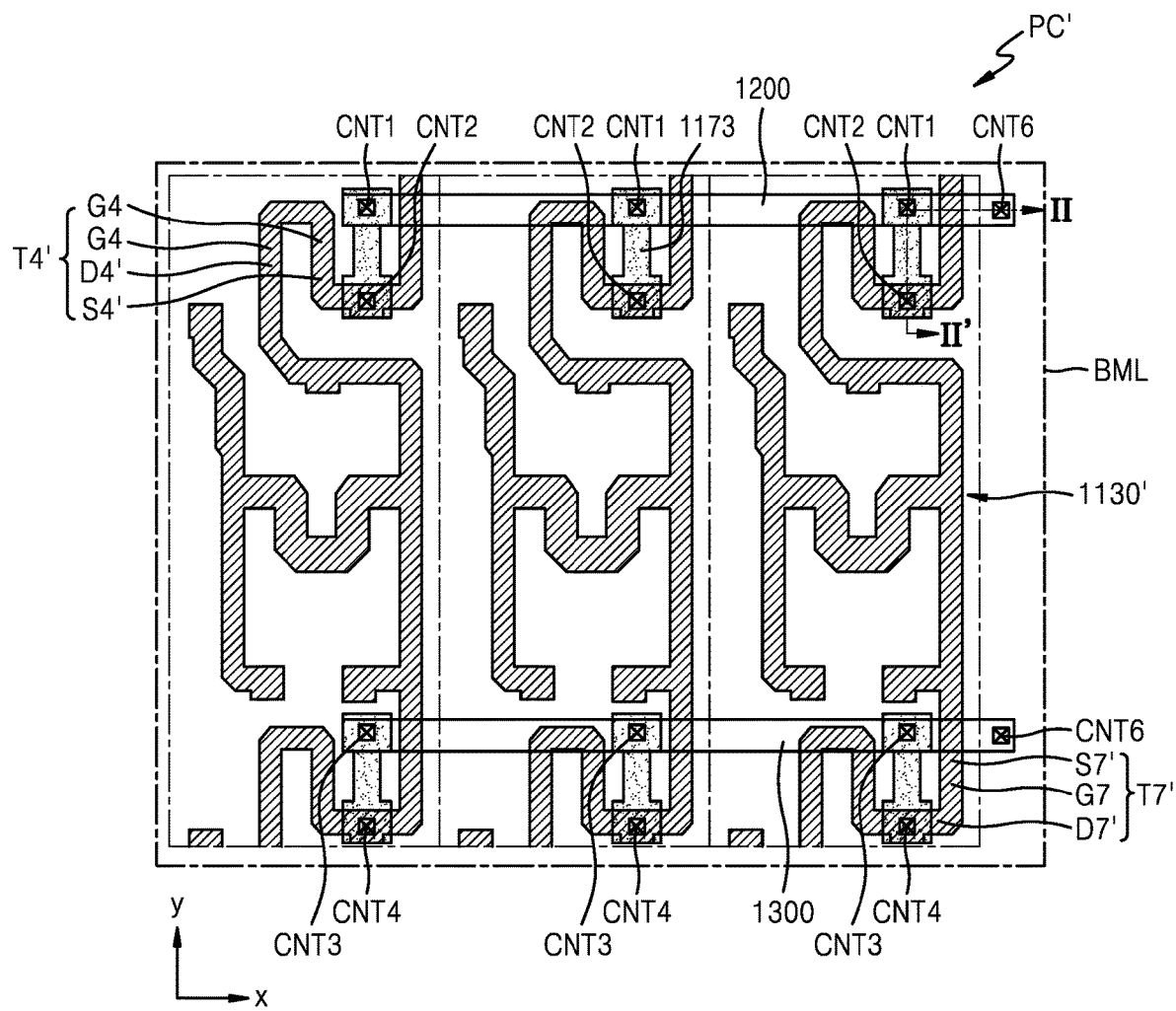
FIG. 11 is a schematic top plan view of a display apparatus, according to an embodiment.
Figure 12:
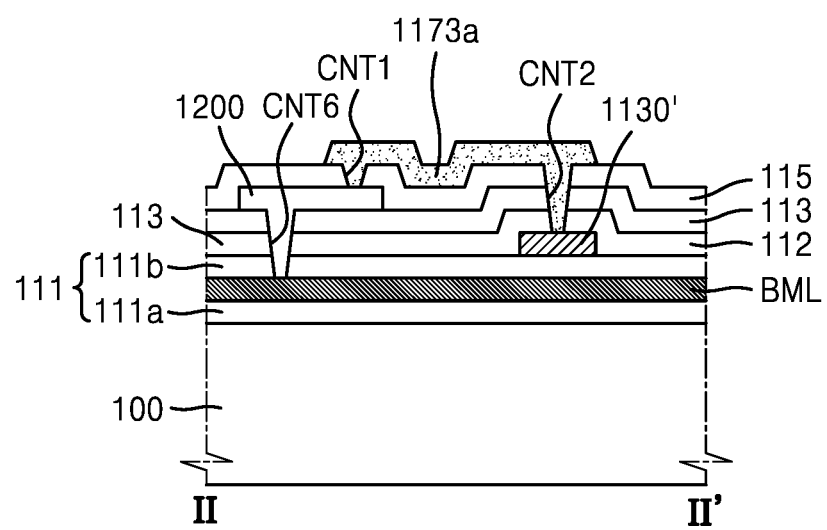
FIG. 12 is a schematic cross-sectional view of a display apparatus, according to an embodiment.

FIG. 11 is a schematic top plan view of a display apparatus, according to an embodiment, and FIG. 12 is a schematic cross-sectional view of a display apparatus, according to an embodiment. FIG. 12 corresponds to a cross-sectional view of the display apparatus taken along the line II-II' of FIG. 11. The embodiments of FIGS. 11 and 12 are different from the embodiments of FIGS. 9 and 10 in that the bottom metal layer BML in FIGS. 11 and 12 is directly connected to the first wire 1200 and the second wire 1300. In FIGS. 11 and 12, the same reference numerals as those in FIGS. 9 and 10 denote the same or substantially the same elements, and thus, the differences therebetween will be mainly described and redundant descriptions thereof may not be repeated.

Referring to FIGS. 11 and 12, the first wire 1200 included in the auxiliary pixel circuit PC' may be arranged by extending in the x direction. The first wire 1200 may be directly and electrically connected to the bottom metal layer BML via a sixth contact hole CNT6. The first wire 1200 may be electrically connected to the bottom metal layer BML via the sixth contact hole CNT6, and thus, the first wire 1200 may have the same or substantially the same constant voltage as that of the bottom metal layer BML.

The first wire 1200 may extend toward the first auxiliary pixel circuit and the second auxiliary pixel circuit, and thus, may apply the same constant voltage as that of the bottom metal layer BML to the first auxiliary pixel circuit and the second auxiliary pixel circuit.

Such a structure may be applied to the second auxiliary initializing thin-film transistor T7' arranged on a lower side of the auxiliary pixel circuit PC'.

Figure 13:
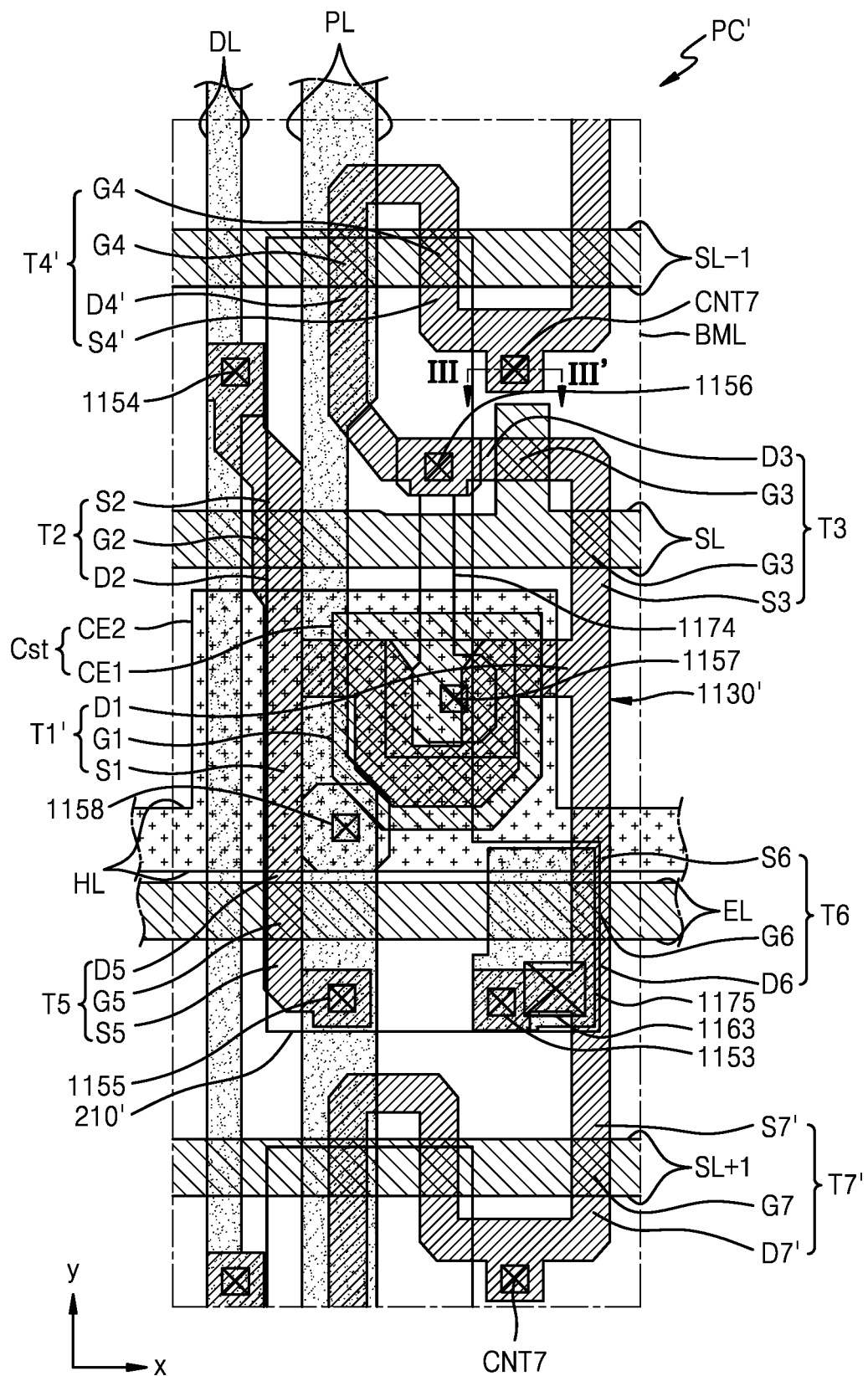
FIG. 13 is a schematic top plan view of a display apparatus, according to an embodiment.
Figure 14:
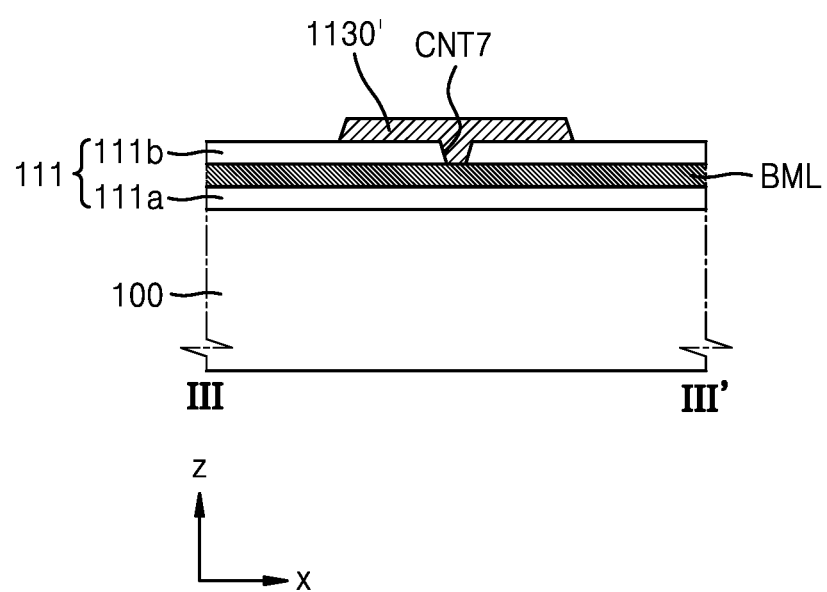
FIG. 14 is a schematic cross-sectional view of a display apparatus, according to an embodiment.

FIG. 13 is a schematic top plan view of a display apparatus, according to an embodiment, and FIG. 14 is a schematic cross-sectional view of a display apparatus, according to an embodiment. FIG. 14 corresponds to a cross-sectional view of the display apparatus taken along the line III-III' of FIG. 13. An embodiment of FIG. 13 is different from the embodiment of FIG. 8 in that the first wire 1200 and the second wire 1300 are omitted, and the bottom metal layer BML is directly and electrically connected to the auxiliary semiconductor layer 1130'. In FIG. 13, the same reference numerals as those in FIG. 8 denote the same or substantially the same elements, and thus, differences therebetween will be mainly described and redundant descriptions thereof may not be repeated.

Referring to FIGS. 13 and 14, the auxiliary semiconductor layer 1130' of the auxiliary pixel circuit PC' may be directly and electrically connected to the bottom metal layer BML via a seventh contact hole CNT7. The auxiliary semiconductor layer 1130' may be directly connected to the bottom metal layer BML via the seventh contact hole CNT7, and thus, the auxiliary semiconductor layer 1130' may have the same or substantially the same constant voltage as that of the bottom metal layer BML. For example, as will be described in more detail below with reference to FIG. 15, the bottom metal layer BML may have a constant or substantially constant voltage corresponding to an initializing voltage by being electrically connected to the initializing voltage line VL that transmits the initializing voltage to the main pixel circuit PC, and thus, the constant voltage corresponding to the initializing voltage may be applied to the auxiliary semiconductor layer 1130'.

Figure 15:
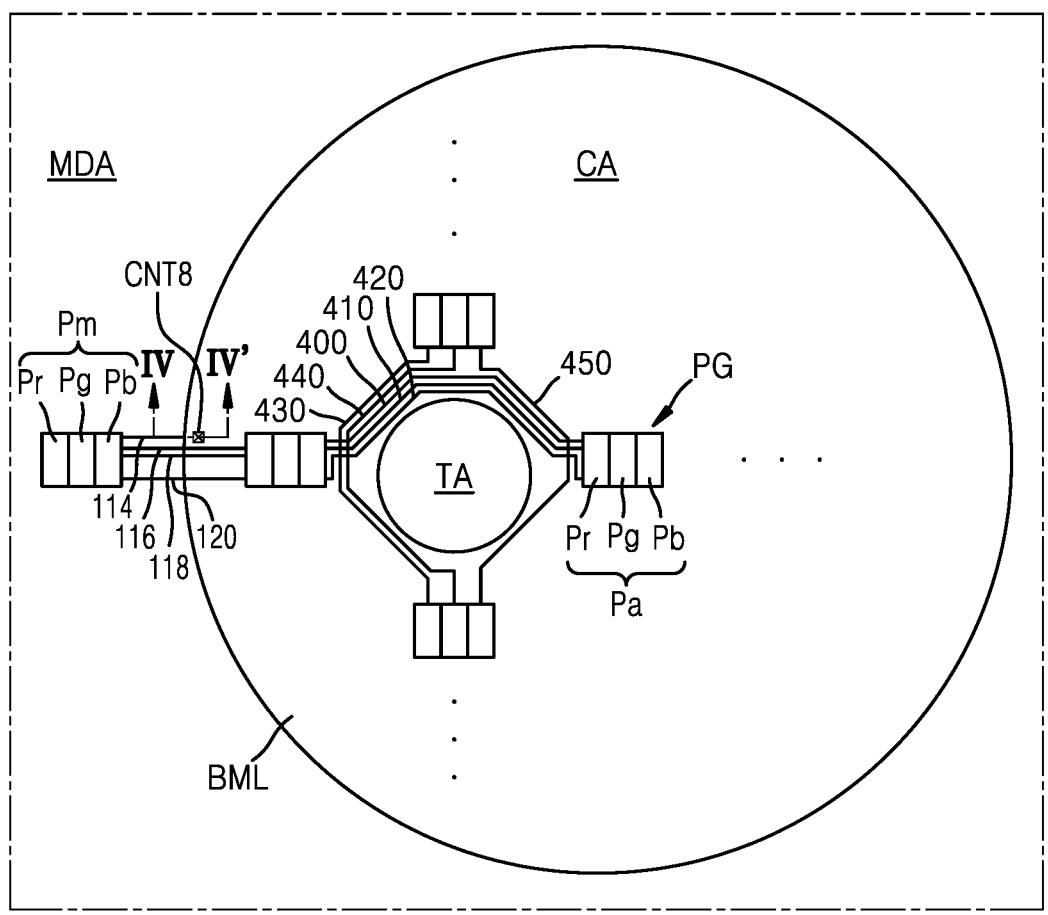
FIG. 15 is a schematic top plan view of a display apparatus, according to an embodiment.
Figure 16:
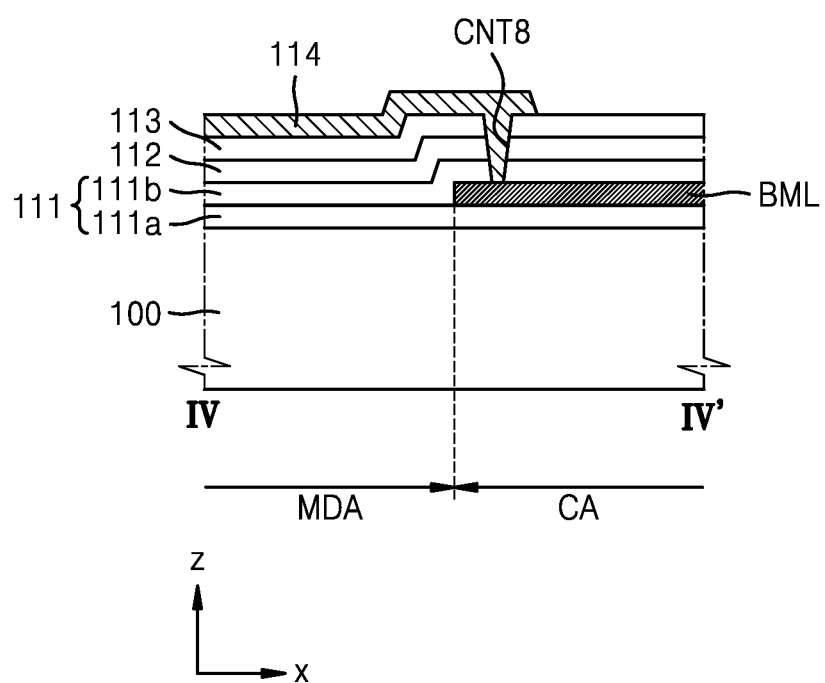
FIG. 16 is a schematic cross-sectional view of a display apparatus, according to an embodiment.

FIG. 15 is a schematic top plan view of a display apparatus, according to an embodiment, and FIG. 16 is a schematic cross-sectional view of a display apparatus, according to an embodiment. FIG. 16 corresponds to a cross-sectional view of the display apparatus taken along the line IV-IV' of FIG. 15.

Referring to FIG. 15, the component area CA may include a pixel group PG including a plurality of auxiliary sub-pixels Pa, and the transmission area TA in the vicinity of the pixel group PG. The pixel group PG is a group of sub-pixels, in which the plurality of auxiliary sub-pixels Pa are grouped in a suitable number (e.g., in a predetermined or preset unit). The pixel groups PG may be spaced apart from each other, and the transmission area TA may be defined as an area between the pixel groups PG.

Each of a plurality of main sub-pixels Pm may include a main display element, for example, such as the main organic light-emitting diode OLED (in FIG. 4). Each of the main sub-pixels Pm may emit light of any suitable one from among red light, green light, blue light, and white light.

Each of the plurality of auxiliary sub-pixels Pa may include an auxiliary display element, for example, such as the auxiliary organic light-emitting diode OLED' (in FIG. 4). Each of the auxiliary sub-pixels Pa may emit light of any suitable one from among red light, green light, blue light, and white light. FIG. 15 illustrates that one pixel group PG includes a red sub-pixel Pr, a green sub-pixel Pg, and a blue sub-pixel Pb, which are arranged in a row in the x direction, and that the pixel groups are spaced apart from each other in a zigzag shape in a diagonal direction of the x direction and the y direction crossing the x direction. However, the present disclosure is not limited thereto, and the number and/or arrangement of the auxiliary sub-pixels Pa included in the pixel group PG may be variously modified and designed according to a desired resolution of the component area CA.

The transmission area TA is an area where an auxiliary sub-pixel Pa is not arranged within the component area CA. In other words, an auxiliary pixel electrode, an auxiliary emission layer, and an opposite electrode, which constitute the auxiliary organic light-emitting diode OLED', and the auxiliary pixel circuit PC' (in FIG. 4) electrically connected to the auxiliary organic light-emitting diode OLED' (in FIG. 4) may not be arranged at (e.g., in or on) the transmission area TA.

The bottom metal layer BML may be arranged above the component 20 at (e.g., in or on) the component area CA excluding the transmission area TA. In other words, a size and shape of the transmission area TA may be defined by the bottom metal layer BML arranged above the component 20 at (e.g., in or on) the component area CA.

The main sub-pixel Pm arranged at (e.g., in or on) the main display area MDA and the auxiliary sub-pixel Pa arranged at (e.g., in or on) the component area CA may be electrically connected to each other by using a first horizontal wire 116, a second horizontal wire 118, and a third horizontal wire 120. For example, each of the first horizontal wire 116, the second horizontal wire 118, and the third horizontal wire 120 may be at least one of the previous scan line SL−1 (in FIG. 6), the scan line SL (in FIG. 6), the post scan line SL+1 (in FIG. 6), or the light-emission control line EL (in FIG. 6).

Bypass wires bypassing the transmission area TA may be arranged at (e.g., in or on) the component area CA. The bypass wires bypassing the transmission area TA may include a first bypass wire 400, a second bypass wire 410, a third bypass wire 420, a fourth bypass wire 430, a fifth bypass wire 440, and a sixth bypass wire 450. The bottom metal layer BML may overlap with the first bypass wire 400, the second bypass wire 410, the third bypass wire 420, the fourth bypass wire 430, the fifth bypass wire 440, and the sixth bypass wire 450 at (e.g., in or on) the component area CA. The pixel groups PG arranged at (e.g., in or on) the component area CA may be connected to each other by using the first to sixth bypass wires 400, 410, 420, 430, 440, and 450. In more detail, pixel groups PG spaced apart from each other in the x direction may be connected to each other by using the first bypass wire 400, the second bypass wire 410, and the third bypass wire 420, and pixel groups GP spaced apart from each other in the y direction may be connected to each other by using the fourth bypass wire 430, the fifth bypass wire 440, and the sixth bypass wire 450. The first to sixth bypass wires 400, 410, 420, 430, 440, and 450 connecting the pixel groups PG that are spaced apart from each other in the x direction or the y direction may bypass the transmission area TA. For example, the first to sixth bypass wires 400, 410, 420, 430, 440, and 450 may each be at least one of the previous scan line SL−1 (in FIG. 6), the scan line SL (in FIG. 6), the post scan line SL+1 (in FIG. 6), the light-emission control line EL (in FIG. 6), the data line DL (in FIG. 6), or the driving voltage line PL (in FIG. 6).

A first conductive layer 114 may be arranged at (e.g., in or on) the main display area MDA. The first conductive layer 114 may be electrically connected to the main pixel circuit PC arranged above the substrate 100 (in FIG. 4) corresponding to the main display area MDA. For example, the first conductive layer 114 may be electrically connected to the initializing voltage lines VL1 and VL2, which are connected to the first main initializing thin-film transistor T4 and the second main initializing thin-film transistor T7, as described with reference to FIG. 6. For example, the first conductive layer 114 may be integrally provided with the initializing voltage lines VL1 and VL2.

As described above with reference to FIG. 2, the component 20 may be arranged under the component area CA. To operate the component 20 arranged under the component area CA, the component area CA may have a light transmittance greater than or equal to a suitable or desired value (e.g., a predetermined value). However, there may be a difficulty in securing the light transmittance greater than or equal to the value (e.g., the predetermined value) by arranging the auxiliary sub-pixels Pa and the wires for connecting the auxiliary sub-pixels Pa to each other.

One or more example embodiments of the present disclosure may address various problems such as the difficulty described above, and may enable the component 20 arranged under the component area CA to operate as desired (e.g., to smoothly operate) by reducing the number of wires for connecting the auxiliary sub-pixels Pa to each other, and thereby improving a light transmittance of the component area CA.

As described above with reference to FIG. 6, the initializing voltage lines VL1 and VL2, which are configured to transmit the initializing voltage Vint to the driving gate electrode G1 of the main driving thin-film transistor T1 and the main pixel electrode 210 (in FIG. 4) of the main organic light-emitting diode OLED, may be arranged at (e.g., in or on) the main display area MDA, and the initializing voltage lines VL1 and VL2 arranged at (e.g., in or on) the main display area MDA may be omitted from the component area CA. As the initializing voltage lines VL1 and VL2 are omitted from the component area CA, a size of the transmission area TA may increase, and thus, a light transmittance of the component area CA may be improved. As the light transmittance of the component area CA is improved, reliability of the display apparatus may also be improved.

Referring to FIGS. 8, 9, 15, and 16, because the initializing voltage Vint may also be provided to the auxiliary gate electrode G2 of the auxiliary driving thin-film transistor T1' and the auxiliary pixel electrode 210' of the auxiliary organic light-emitting diode OLED', which are arranged at (e.g., in or on) the component area CA, at least a portion of the first conductive layer 114 arranged at (e.g., in or on) the main display area MDA may extend toward the component area CA. The at least the portion of the first conductive layer 114 that extends toward the component area CA may be electrically connected to the bottom metal layer BML arranged at (e.g., in or on) the component area CA via an eighth contact hole CNT8. The bottom metal layer BML and the first conductive layer 114 may be electrically connected to each other via the eighth contact hole CNT8 defined at (e.g., in or on) the component area CA. Accordingly, the bottom metal layer BML arranged at (e.g., in or on) the component area CA may have a constant or substantially constant voltage (for example, -2V) corresponding to an initializing voltage.

In addition, the bottom metal layer BML may be electrically connected to the auxiliary semiconductor layer 1130' in a direct or indirect manner via the first to seventh contact holes CNT1, CNT2, CNT3, CNT4, CNT5, CNT6, and CNT7, and thus, a constant or substantially constant voltage (for example, -2V) corresponding to an initializing voltage may be applied to an auxiliary drain electrode of the first auxiliary initializing thin-film transistor T4' and an auxiliary source electrode of the second auxiliary initializing thin-film transistor T7'. Accordingly, the first auxiliary initializing thin-film transistor T4' may perform an initialization operation of initializing a voltage of a driving gate electrode of the auxiliary driving thin-film transistor T1', and the second auxiliary initializing thin-film transistor T7' may perform an initialization operation of initializing a voltage of the auxiliary pixel electrode 210' of the auxiliary organic light-emitting diode OLED'.

The transmission area TA defined by the bottom metal layer BML may be provided in a circular shape (e.g., in a plan view). The transmission area TA is provided in a circular shape, and thus, scattering of light emitted from the component 20 (in FIG. 2) or light incident onto the component 20 (in FIG. 2) may be minimized or reduced.

Figure 17:
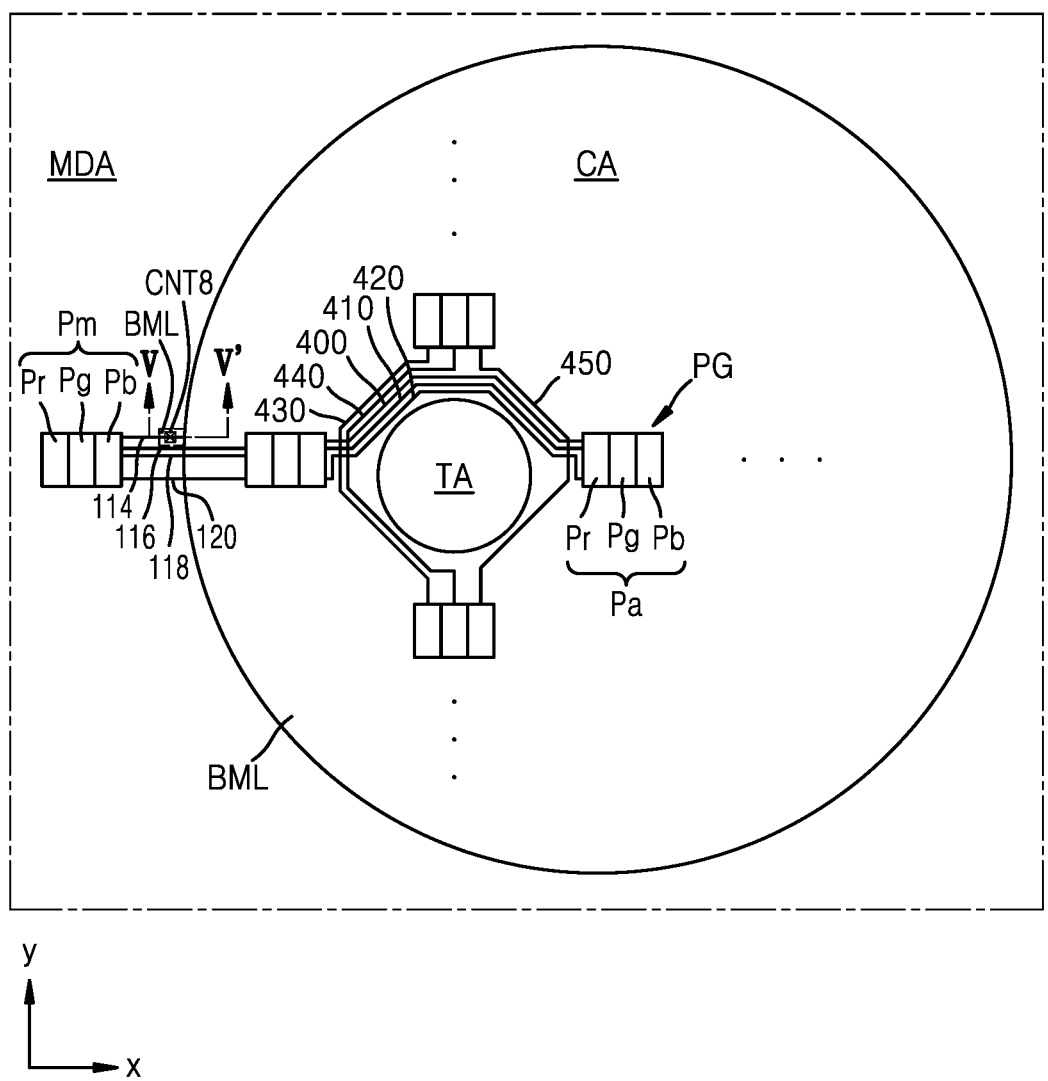
FIG. 17 is a schematic top plan view of a display apparatus, according to an embodiment.
Figure 18:
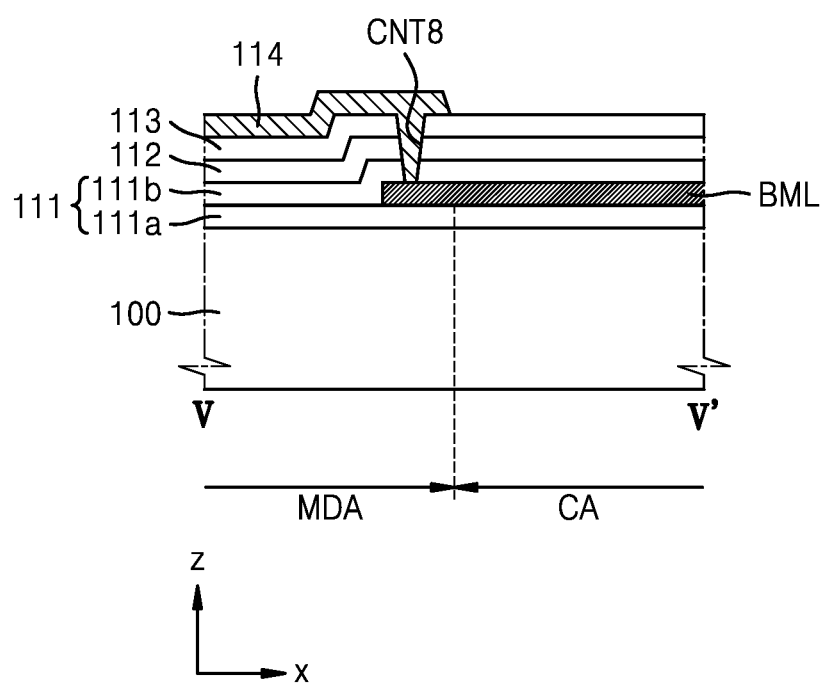
FIG. 18 is a schematic cross-sectional view of a display apparatus, according to an embodiment.

FIG. 17 is a schematic top plan view of a display apparatus, according to an embodiment, and FIG. 18 is a schematic cross-sectional view of a display apparatus, according to an embodiment. FIG. 18 corresponds to a cross-sectional view of the display apparatus taken along the line V-V' of FIG. 17. In FIGS. 17 and 18, the same reference numerals as those in FIGS. 15 and 16 denote the same or substantially the same elements, and thus, the differences therebetween may be mainly described and redundant descriptions thereof may not be repeated.

Referring to FIGS. 17 and 18, at least a portion of the bottom metal layer BML arranged at (e.g., in or on) the component area CA may extend onto the main display area MDA. The at least the portion of the bottom metal layer BML that extends toward the main display area MDA may be electrically connected to the first conductive layer 114 arranged at (e.g., in or on) the main display area MDA via the eighth contact hole CNT8. Because the bottom metal layer BML and the first conductive layer 114 is electrically connected to each other via the eighth contact hole CNT8 defined at (e.g., in or on) the main display area MDA, the bottom metal layer BML arranged at (e.g., in or on) the component area CA may have a constant or substantially constant voltage (for example, -2V) corresponding to an initializing voltage.

Figure 19:
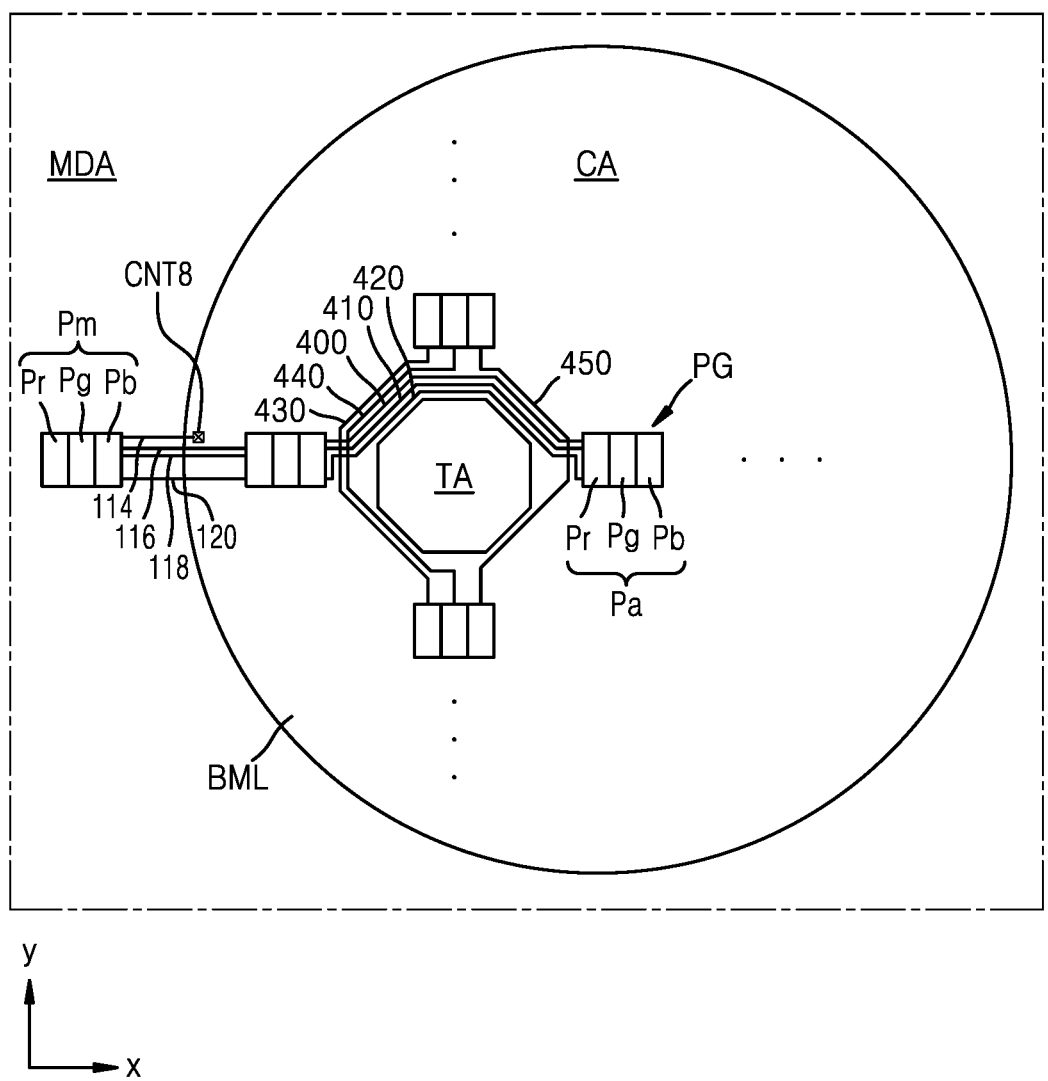
FIG. 19 is a schematic top plan view of a display apparatus, according to an embodiment.

FIG. 19 is a schematic top plan view of a display apparatus, according to an embodiment. In FIG. 19, the same reference numerals as those in FIG. 15 denote the same or substantially the same elements, and thus, the differences therebetween will be mainly described and redundant descriptions thereof may not be repeated.

Referring to FIG. 19, the transmission area TA defined by the bottom metal layer BML may be provided in a polygonal shape (e.g., in a plan view) instead of a circular shape. As the transmission area TA is provided in a polygonal shape (e.g., in a plan view) instead of a circular shape, a size of the transmission area TA may increase, and thus, a light transmittance of the component area CA may be improved.

Unlike the main display area MDA, the component area CA may include a pixel group PG including a plurality of auxiliary sub-pixels Pa, and the transmission area TA in the vicinity of the pixel group PG. The pixel group PG is a group of sub-pixels, in which the plurality of auxiliary sub-pixels Pa are grouped in a suitable number (e.g., a predetermined or preset unit), and because pixel groups PG may be spaced apart from each other with the transmission area TA therebetween, wires for electrically connecting the pixel groups PG to each other are used.

The wires electrically connecting the pixel groups PG of the component area CA bypass an outer side of the transmission area TA, and due to the wires, a size of the transmission area TA decreases such that a transmittance of the transmission area TA may decrease.

According to an embodiment, a transmittance of the transmission area TA may be improved by reducing the number of wires that are electrically connecting the pixel groups PG of the component area CA to each other, and thereby increasing a size of the transmission area TA.

According to one or more example embodiments as described above, a display apparatus including a component area where various kinds of components may be arranged within a display area may be implemented. However, the aspects and features of the present disclosure are not limited thereto.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display apparatus comprising:
a substrate comprising a main display area, a component area including a transmission area, and a peripheral area at an outer side of the main display area;
a buffer layer above the substrate;
a main pixel circuit at the main display area, and comprising a main semiconductor layer above the buffer layer;
an auxiliary pixel circuit at the component area, and comprising a first wire and an auxiliary semiconductor layer spaced apart from the main semiconductor layer;
an auxiliary pixel electrode on the auxiliary pixel circuit of the component area; and
a bottom metal layer between the substrate corresponding to the component area and the auxiliary pixel circuit, and electrically connected to the first wire,
wherein the bottom metal layer has a hole at the transmission area of the component area to allow light to be transmitted through the hole of the bottom metal layer at the transmission area, and the buffer layer covers a side surface of the bottom metal layer facing the hole.

2. The display apparatus of claim 1, wherein the first wire is configured to transmit an initializing voltage to the auxiliary pixel circuit.

3. The display apparatus of claim 2, wherein the auxiliary pixel circuit further comprises a second wire, and
the bottom metal layer is electrically connected to the second wire.

4. The display apparatus of claim 3, wherein the second wire is configured to transmit the initializing voltage to the auxiliary pixel circuit.

5. The display apparatus of claim 4, further comprising:
a plurality of main sub-pixels at the main display area;
a plurality of pixel groups at the component area and spaced apart from each other with the transmission area therebetween; and
a plurality of bypass wires at the component area and bypassing the transmission area.

6. The display apparatus of claim 5, wherein the auxiliary pixel circuit comprises a plurality of auxiliary pixel circuits,
each of the plurality of the pixel groups comprises a plurality of auxiliary sub-pixels,
each of the plurality of auxiliary sub-pixels comprises an auxiliary display element electrically connected to a corresponding one of the auxiliary pixel circuits, and
each of the auxiliary pixel circuits comprises an auxiliary driving thin-film transistor configured to supply a driving current to the auxiliary display element, a first auxiliary initializing thin-film transistor configured to initialize a driving gate voltage of the auxiliary driving thin-film transistor, and a second auxiliary initializing thin-film transistor configured to initialize an auxiliary pixel electrode of the auxiliary display element.

7. The display apparatus of claim 6, wherein the first wire is configured to transmit the initializing voltage to the first auxiliary initializing thin-film transistor, and the second wire is configured to transmit the initializing voltage to the second auxiliary initializing thin-film transistor.

8. The display apparatus of claim 5, wherein the main pixel circuit comprises a plurality of main pixel circuits,
the main pixel circuits comprise an initializing voltage line,
each of the plurality of the main sub-pixels comprises a main display element electrically connected to a corresponding one of the main pixel circuits,
each of the main pixel circuits further comprises a main driving thin-film transistor configured to supply a driving current to the main display element, a first main initializing thin-film transistor configured to initialize a driving gate voltage of the main driving thin-film transistor, and a second main initializing thin-film transistor configured to initialize a main pixel electrode of the main display element, and
the initializing voltage line is configured to transmit an initializing voltage to the first main initializing thin-film transistor or the second main initializing thin-film transistor.

9. The display apparatus of claim 8, wherein the initializing voltage line and the bottom metal layer are electrically connected to each other at the component area.

10. The display apparatus of claim 8, wherein the initializing voltage line and the bottom metal layer are electrically connected to each other at the main display area.

11. The display apparatus of claim 5, wherein the bottom metal layer at least partially overlaps with the bypass wires.

12. The display apparatus of claim 1, wherein the transmission area has a circular shape on a plane.

13. The display apparatus of claim 1, wherein the transmission area has a polygonal shape on a plane.

14. The display apparatus of claim 1, further comprising a component at the component area under the substrate,
wherein the component comprises an image pickup device or a sensor.

15. A display apparatus comprising:
a substrate comprising a main display area, a component area including a transmission area, and a peripheral area at an outer side of the main display area;
a buffer layer above the substrate;
a main pixel circuit at the main display area, and comprising a main semiconductor layer above the buffer layer;
an auxiliary pixel circuit at the component area, and comprising an auxiliary semiconductor layer spaced apart from the main semiconductor layer;

an auxiliary pixel electrode on the auxiliary pixel circuit of the component area; and a bottom metal layer at the substrate corresponding to the component area and the auxiliary pixel circuit, and electrically connected to the auxiliary semiconductor layer, wherein the bottom metal layer has a hole at the transmission area of the component area to allow light to be transmitted through the hole of the bottom metal layer at the transmission area, and the buffer layer covers a side surface of the bottom metal layer facing the hole.

16. The display apparatus of claim 15, wherein the auxiliary semiconductor layer and the bottom metal layer are electrically connected to each other via a contact hole.

17. The display apparatus of claim 16, wherein the main pixel circuit further comprises an initializing voltage line, and the initializing voltage line is electrically connected to the bottom metal layer.

18. The display apparatus of claim 17, wherein the initializing voltage line is configured to transmit an initializing voltage to the main pixel circuit.

19. The display apparatus of claim 15, wherein the transmission area is defined by the bottom metal layer.

* * * * *